United States Patent
Lee et al.

(10) Patent No.: US 12,300,352 B2
(45) Date of Patent: May 13, 2025

(54) SEMICONDUCTOR DEVICE

(71) Applicant: Samsung Electronics Co., Ltd., Suwon-si (KR)

(72) Inventors: Jaewoo Lee, Suwon-si (KR); Yonghun Kim, Suwon-si (KR); Kihan Kim, Suwon-si (KR); ChangSik Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 142 days.

(21) Appl. No.: 18/189,580

(22) Filed: Mar. 24, 2023

(65) Prior Publication Data

US 2023/0377621 A1 Nov. 23, 2023

(30) Foreign Application Priority Data

May 18, 2022 (KR) .......... 10-2022-0061062
Sep. 5, 2022 (KR) .......... 10-2022-0112102

(51) Int. Cl.
*G11C 8/00* (2006.01)
*G11C 7/10* (2006.01)
*G11C 7/22* (2006.01)
*G11C 29/02* (2006.01)

(52) U.S. Cl.
CPC ............ *G11C 7/222* (2013.01); *G11C 7/1066* (2013.01); *G11C 7/1093* (2013.01); *G11C 29/023* (2013.01); *G11C 2207/2254* (2013.01)

(58) Field of Classification Search
CPC ..... G11C 16/32; G11C 7/1045; G11C 7/1078; G11C 7/1093; G11C 7/22; G11C 16/10

USPC .......... 365/233.12, 233.11
See application file for complete search history.

(56) References Cited

U.S. PATENT DOCUMENTS

| | | |
|---|---|---|
| 6,934,215 B2 | 8/2005 | Chung et al. |
| 7,259,606 B2 | 8/2007 | Ku et al. |
| 7,500,155 B2 | 3/2009 | Prodanov et al. |
| 8,437,216 B2 | 5/2013 | Oh et al. |
| 9,998,125 B2 | 6/2018 | Balamurugan et al. |
| 10,191,797 B2 | 1/2019 | Lee |
| 10,628,254 B2 | 4/2020 | Lee |
| 10,998,905 B2 * | 5/2021 | Jang .......... H03K 5/135 |

FOREIGN PATENT DOCUMENTS

| | | |
|---|---|---|
| KR | 100486256 B1 | 5/2005 |
| KR | 20150142852 A | 12/2015 |

* cited by examiner

*Primary Examiner* — Son T Dinh
(74) *Attorney, Agent, or Firm* — Myers Bigel, P.A.

(57) ABSTRACT

A semiconductor device includes: a clock generation circuit configured to output a plurality of clock signals that have different phases to a memory device, an internal clock signal of the memory device being generated responsive to the plurality of clock signals; and a training circuit configured to receive an output signal output based on the internal clock signal from the memory device, to adjust a value of a code used to generate the internal clock signal by adjusting the phase of at least one clock signal among the plurality of clock signals, to determine a final value of the code based on a duty cycle of the output signal, which is changed according to the adjustment of the value of the code, and to write the final value to the memory device.

20 Claims, 21 Drawing Sheets

FIG. 7

| OP11 | -7 | -6 | -5 | -4 | -3 | -2 | -1 | 0 | 1 | 2 | 3 | 4 | 5 | 6 | 7 |
|---|---|---|---|---|---|---|---|---|---|---|---|---|---|---|---|
|  | 0 | 0 | 0 | 0 | 0 | 0 | 0 | 1 | 1 | 1 | 1 | 1 | 1 | 1 | 1 |
| FLIP | 0 | 0 | 0 | 0 | 0 | 0 | 0 | 0 | 1 | 1 | 1 | 1 | 1 | 1 | 1 |

FIG. 8

| OP11 | -7 | -6 | -5 | -4 | -3 | -2 | -1 | 0 | 1 | 2 | 3 | 4 | 5 | 6 | 7 |
|---|---|---|---|---|---|---|---|---|---|---|---|---|---|---|---|
| | 0 | 0 | 0 | 0 | 0 | 0 | 0 | 0 | 0 | 0 | 0 | 0 | 0 | 1 | 1 |
| FLIP | 1 | 0 | 0 | 0 | 0 | 0 | 0 | 0 | 0 | 1 | 1 | 1 | 1 | 1 | 1 |

SEMICONDUCTOR DEVICE

CROSS-REFERENCE TO RELATED APPLICATION

This application claims priority to and the benefit of Korean Patent Application No. 10-2022-0061062 filed in the Korean Intellectual Property Office on May 18, 2022, and Korean Patent Application No. 10-2022-0112102 filed in the Korean Intellectual Property Office on Sep. 5, 2022, the entire contents of which are incorporated herein by reference.

BACKGROUND

(a) Field

The present disclosure relates to a semiconductor device.

(b) Description of the Related Art

A component device, such as a memory device, may require high performance of a computing system including a system-on-chip (SoC). The system-on-chip may provide a data clock signal to the component device separately from a clock signal for high-speed data input/output to the component device. A duty cycle of the clock signal may vary based on temperature, voltage, and the like, and when the exact duty cycle is not used, the read margin for the data signal may degrade. In addition, because the frequency of the data clock signal is higher than the frequency of the clock signal, the duty cycle of the data clock signal may need to be adjusted more accurately.

SUMMARY

Some embodiments may provide a semiconductor device for training an optimal duty cycle of a data clock signal.

Some embodiments may provide a semiconductor device that trains a data clock signal using an output signal of a component device.

A semiconductor device according to an embodiment includes: a clock generation circuit configured to output a plurality of clock signals that have different phases to a memory device, an internal clock signal of the memory device being generated responsive to the plurality of clock signals; and a training circuit configured to receive an output signal output based on the internal clock signal from the memory device, to adjust a value of a code used to generate the internal clock signal by adjusting the phase of at least one clock signal among the plurality of clock signals, to determine a final value of the code based on a duty cycle of the output signal, which is changed according to the adjustment of the value of the code, and to write the final value to the memory device.

The training circuit may be configured to determine the final value based on values of codes that change the duty cycle of the output signal more than a duty cycle reference value.

The training circuit may include a duty cycle detector that determines the duty value of the output signal according to whether the duty cycle of the output signal is greater than or equal to the duty cycle reference value, and the training circuit may be configured to determine the final value based on the values of the code in which the duty value of the output signal changes.

The duty cycle detector is configured to determine a duty value of a first output signal output by the memory device in synchronization with the internal clock signal for a first test pattern and a duty value of a second output signal output by the memory device in synchronization with the internal clock signal of a second test pattern, which is inverted the first test pattern, and the training circuit may be configured to determine the final value based on two adjacent values of the code at which the duty value of the first output signal changes and two adjacent values of the code at which the duty value of the second output signal changes.

The training circuit may is configured to determine the final value based on two adjacent values of the code that changes a value of a first output signal that outputs a duty value of a first signal determined according to whether a duty cycle of the first signal serialized from a first test pattern in synchronization with the internal clock signal by the memory device is greater than or equal to a duty cycle reference value and two adjacent values of the code that changes a value of a second output signal that outputs a duty value of a second signal determined according to whether a duty cycle of the second signal serialized from a second test pattern, which is inverted from the first test pattern, in synchronization with the internal clock signal, is greater than or equal to the duty cycle reference value.

The code may include a code used in generation of the internal clock signal by adjusting a duty cycle of at least one clock signal among the plurality of clock signals.

The code may include a code used in generation of the internal clock signal by adjusting a delay of at least one clock signal among the plurality of clock signals.

The memory device may be a low power double data rate 6 (LPDDR6) SDRAM.

An operation method of a semiconductor device according to an embodiment includes: outputting, to a memory device, a plurality of clock signals that have different phases and are used to generate an internal clock signal of the memory device; outputting a code used to generate the internal clock signal by adjusting the phase of at least one clock signal among the plurality of clock signals; receiving an output signal output based on the internal clock signal from the memory device; adjusting a value of the code; determining a final value of the code based on a duty cycle of the output signal, which changes according to adjustment of the value of the code; and writing the final value to the memory device.

The determining the final value may include determining the final value based on values of the code that change the duty cycle of the output signal by more than a duty cycle reference value.

The operation method of the semiconductor device may further include determining a duty value of the output signal according to whether the duty cycle of the output signal is greater than or equal to the duty cycle reference value, wherein the determining the final value based on the values of the code that change the duty cycle of the output signal may include determining the final value based on the values of the code that change the duty value of the output value.

The receiving the output signal from the memory device may include: receiving a first output signal that outputs a first test pattern in synchronization with the internal clock signal; and receiving a second output signal that outputs a second test pattern inverted from the first test pattern in synchronization with the internal clock signal, and the determining a duty value of the output signal may include determining a duty value of the first output signal and determining a duty value of the second output signal, and the determining the final value based on values of a code that changes the duty value of the output signal may include determining the final value based on two adjacent values of the code that changes the duty value of the first output signal and two adjacent values of the code that changes the duty value of the second output signal.

The receiving the output signal from the memory device may include receiving, as a first output signal from the memory device, a duty value of a first signal determined according to whether a duty cycle of the first signal that serializes a first test pattern in synchronization with the internal clock signal by the memory device is greater than or equal to the duty cycle reference value; and receiving, as a second output signal from the memory device, a duty value of a second signal determined according to whether a duty cycle of the second signal that serializes a second test pattern inverted from the first test pattern in synchronization with the internal clock signal is greater than or equal to the duty cycle reference value, and the determining the final value based on values of the code may include determining the final value based on two adjacent values of the code that changes a value of the first output signal and two adjacent values of the code that changes a value of the second output signal.

The code may include a code used to generate the internal clock signal by adjusting the duty cycle of the at least one clock signal among the plurality of clock signals.

The code may include a code used to generate the internal clock signal by adjusting a delay of the at least one clock signal among the plurality of clock signals.

A computing system according to an embodiment includes: a memory device that includes a clock control circuit configured to generate a plurality of internal clock signals by buffering a plurality of clock signals, each having a different phase, and configured to generate at least one internal clock signal among the plurality of internal clock signals by adjusting the phase of at least one of the plurality of clock signals according to a code, and a read circuit that is configured to serialize a test pattern based on the plurality of internal clock signals and to output an output signal; and a system-on-chip that is configured to adjust a value of the code, to determine a final value of the code based on a value of at least one code that changes a duty cycle of the output signal by more than a duty cycle reference value, and to write the final value in the memory device.

The code may include a first code and a second code, the final value may include a final value of the first code and a final value of the second code, and the clock control circuit may include a first buffer that is configured to adjust a duty cycle of the plurality of clock signals according to the first code, and a second buffer that is configured to adjust a delay of the plurality of clock signals according to the second code.

The plurality of internal clock signals may include a first internal clock signal and a second internal clock signal that have complementary phases, and a third internal clock signal and a fourth internal clock signal that have complementary phases, the test pattern may include a first test pattern of which a value is changed in synchronization of the first internal clock signal and the second internal clock signal and is maintained in synchronization with the third internal clock signal and the fourth internal clock signal, and the system-on-chip may be configured to determine a final value of the first code based on a value of at least one first code that changes a duty cycle of an output signal output based on the first test pattern by more than the duty cycle reference value.

The test pattern may include a second test pattern of which a value is changed in synchronization with the first internal clock signal to the fourth internal clock signal, and the system-on-chip may be configured to determine a value of the second code based on the value of the second code that changes a duty cycle of an output signal output based on the second test pattern by more than the duty cycle reference value.

The read circuit may include: a FIFO that is configured to output a first test pattern or a second test pattern inverted from the first test pattern; and a selector that is configured to serialize the first test pattern or the second test pattern in synchronization with the plurality of internal clock signals and to output the first test pattern or the second test pattern as the output signal.

BRIEF DESCRIPTION OF THE DRAWINGS

FIG. 7 and FIG. 8 are tables that illustrate a code for adjusting a duty cycle of an internal data clock signal according to an embodiment.

DETAILED DESCRIPTION OF THE EMBODIMENTS

Figure 1:
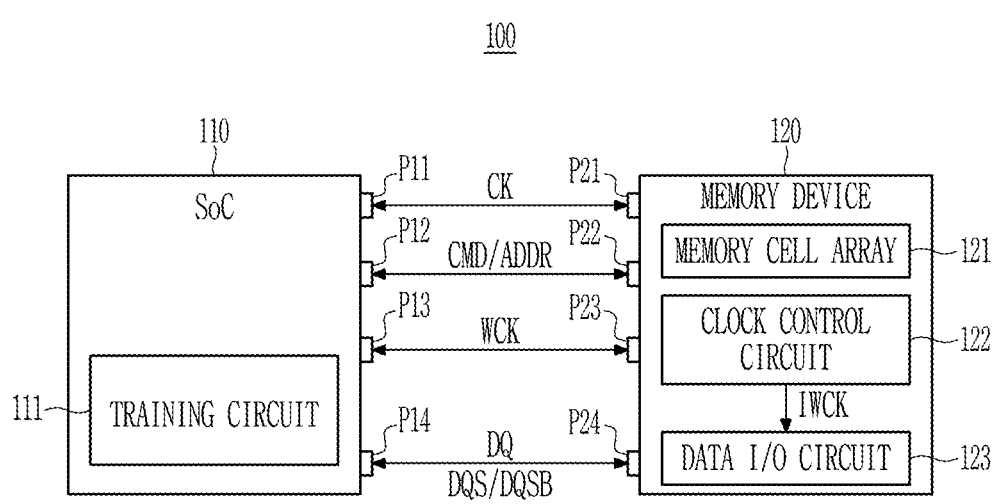
FIG. 1 is an example block diagram of a computing system according to an embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the flowchart described with reference to drawing, the order of operations may be changed, several operations may be merged, some operations may be divided, and specific operations may not be performed.

In addition, expressions written in the singular may be construed as singular or plural unless explicit expressions such as "one" or "single" are used. Terms including ordinal numbers such as first, second, and the like may be used to describe various configurations elements, but constituent elements are not limited by these terms. These terms may be used for the purpose of distinguishing one constituent element from other constituent elements.

As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is an example block diagram of a computing system according to an embodiment.

Referring to FIG. 1, a computing system 100 may include a system-on-chip 110 and a memory device 120.

The system-on-chip 110 may be electrically connected to the memory device 120. In some embodiments, the system-on-chip 110 and the memory device 120 are connected through a memory interface such that they may transmit and receive signals through the memory interface. In an embodiment, a clock pin P11, a command/address pin P12, a data clock pin P13, and a data pin P14 of the system-on-chip 110 may be connected with a clock pin P21, a command/address pin P22, and a data clock pin P23, and data pin P24 of the memory device 120, respectively.

The system-on-chip 110 may generate a command signal CMD, an address ADDR, a system clock signal CK, and a data clock signal WCK. The system-on-chip 110 may provide a system clock signal CK to the memory device 120 through the clock pins P11 and P21, provide a command signal CMD/address ADDR to the memory device 120 through the command/address pins P12 and P22, and provide a data clock signal WCK to the memory device 120 through the data clock pins P13 and P23.

The system-on-chip 110 may receive a data input/output signal DQ, a data strobe signal DQS, and an inverted data strobe signal DQSB from the memory device 120 through the data pins P14 and P24, or may transmit a data processing result to the memory device 120. The DQS may be used for sampling the DQ. The system-on-chip 110 controls a memory operation of the memory device 120 by providing a signal to the memory device 120. The signal may include the command signal CMD and the address ADDR. In some embodiments, the system-on-chip 110 may provide the command signal CMD and the address ADDR to the memory device 120 to access a memory cell array 121 and control memory operations such as reading or writing. The DQ and the DQS may be transmitted from the memory cell array 121 to the system-on-chip 110 according to a read operation, and the DQ and the DQS may be transmitted from the system-on-chip 110 to the memory cell array 121 according to a writing operation. Since the DQ and the DQS are bi-directional signals, respectively, a DQ and a DQS output to memory device 120 from the system-on-chip 110 may be referred to as a write DQ and a write DQS, respectively, and a DQ and a DQS output from the memory device 120 to system-on-chip 110 may be referred to as a read DQ and a read DQS, respectively.

The command signal CMD may include an activation command, a read/write command, and a refresh command. In some embodiments, the command signal CMD may further include a precharge command. The activation command may be a command for switching a target row of the memory cell array 121 to an active state in order to write data to or read data from the memory cell array 121. A memory cell of a target row may be activated (e.g., driven) in response to the activation command. The read/write command may be a command for performing a read or write operation on a target memory cell of a row switched to an active state. In some embodiments, the read command may be a command that activates an emphasis drive. The refresh command may be a command for performing a refresh operation in the memory cell array 121.

The system-on-chip 110 applies a system clock signal CK and a data clock signal WCK to the memory device 120 to control data input/output. The system clock signal CK may be provided in the form of differential signals having a phase complementary to each other. In addition, the data clock signal WCK may also be provided in the form of differential signals having a phase complementary to each other. The system clock signal CK may be a clock related to a transmission rate of the command signal CMD or address ADDR applied to perform data input/output operations. Meanwhile, the data clock signal WCK may be a clock related to input/output rates of DQ and DQS. In some embodiments, the command CMD and the address signal ADDR are transmitted based on the system clock signal. The DQ and the DQS may be transmitted based on the data clock signal WCK.

The system-on-chip 110 may include a training circuit 111. The training circuit 111 may perform memory core parameter training associated with a memory core including the memory cell array 121, a row decoder, and a column decoder of the memory device 120 and/or peripheral circuit parameter training for the rest of the peripheral circuits except the memory core. The training circuit 111 may determine optimal or desired parameters for the memory core parameters and/or peripheral circuit parameters of the memory device 120. The system-on-chip 110, which includes the training circuit 111, may perform training of the memory device 120. In some embodiments, the training circuit 111 may be included in the memory device 120 such that the memory device 120 may perform training.

In an embodiment, the training circuit 111 may perform training of the data clock signal WCK based on the output signal from the memory device 120.

In some embodiment, the memory device 120 may serialize a first test pattern according to an internal data clock signal IWCK and output it as DQS, and serialize a second test pattern in which the first test pattern is inverted according to the internal data clock signal IWCK to output as DQSB. The training circuit 111 may perform training of the data clock signal WCK based on the DQS or DQSB output from the memory device 120. In some embodiments, the training circuit 111 may sense a duty cycle of the DQS and DQSB. The training circuit 111 may perform training of the data clock signal WCK using the duty cycle of DQS and the duty cycle of DQSB.

The training circuit 111 may generate a code such that the memory device 120 generates the internal data clock signal IWCK by adjusting the phase of the data clock signal WCK. The training circuit 111 may determine a final value of the code based on the duty cycle of the output signal DQS and DQSB, which is changed according to a value of the adjusted code. The training circuit 111 may write the final value of the code to the memory device 120.

For example, the training circuit 111 may provide a first code to the memory device 120 such that the memory device 120 generates the internal data clock signal IWCK by correcting the duty cycle of the data clock signal WCK. The training circuit 111 may adjust a value of the first code. The duty cycle of the data clock signal WCK of the memory device 120 may be corrected according to the adjusted first code. The memory device 120 may buffer the data clock signal WCK with the duty cycle corrected to generate the internal data clock signal IWCK, and may output the DQS or DQSB with the duty cycle that is changed according to the duty cycle of the internal data clock signal IWCK. The training circuit 111 may determine the final value of the first code based on the first code when the duty cycle of the DQS is greater than or equal to a duty cycle reference value (e.g., 50%) and the first code when the duty cycle of the DQSB is greater than or equal to the duty cycle reference value. The training circuit 111 may provide a second code to the memory device 120 such that the memory device 120 shifts the data clock signal WCK to generate the internal data clock signal IWCK. The training circuit 111 may adjust the value of the second code. A delay of the data clock signal WCK of the memory device 120 may be adjusted according to the adjusted second code. The memory device 120 may buffer the delay-adjusted data clock signal WCK to generate the internal data clock signal IWCK, and output the DQS or DQSB with a duty cycle that is changed according to the delay of the internal data clock signal IWCK. The training circuit 111 may determine a final value of the second code based on the second code when the duty cycle of the DQS is greater than or equal to the duty cycle reference value (e.g., 50%) and the second code when the duty cycle of the DQSB is greater than or equal to the duty cycle reference value. The system-on-chip 110 may store the final value of the first code and the final value of the second code in a mode register of the memory device 120 through a mode register write command.

In some embodiments, the memory device 120 may serialize the first test pattern and the second test pattern according to the internal data clock signal IWCK and output a value according to the duty cycle of the output signal as a DQ. The training circuit 111 may perform training of the internal data clock signal IWCK based on the DQ output from the memory device 120. The training circuit 111 may use the value of the DQ to perform training of the internal data clock signal IWCK.

In addition, the system-on-chip 110 may include various intellectual property (IP) circuits. The system-on-chip 110 may be referred to as an application processor (AP).

In some embodiments, the system-on-chip 110 may access the memory device 120 according to a request from a host outside the memory system 100. The system-on-chip 110 may communicate with the host using various protocols.

The memory device 120 may be a storage device based on a semiconductor device. In some embodiments, the memory device 120 may include a dynamic random access memory (DRAM) device. In some embodiments, the memory device 120 may be a static random access memory (SRAM) device, a thyristor random access memory (TRAM) device, a NAND flash memory device, a NOR flash memory device, a resistive random access memory (RRAM) device, a ferroelectric random access memory (FRAM) device memory) device, a phase change random access memory (PRAM) device, a magnetic random access memory (MRAM) device, a solid state drive (SSD), a memory card, a universal flash memory device (UFS), and the like. Hereinafter, the memory device 120 will be described as a DRAM device (i.e., a synchronous dynamic random access memory (SDRAM) device) synchronized with the data clock signal WCK output from the system-on-chip 110. In particular, the memory device 120 may be a low power double data rate 6 (LPDDR6) SDRAM. The memory device 120 may be a component device other than the storage device.

The memory device 120 includes a memory cell array 121, a clock control circuit 122, and a data input/output (I/O) circuit 123. The memory cell array 121 includes a plurality of memory cells connected to a plurality of rows and a plurality of columns. In some embodiments, rows may be defined by word lines and columns may be defined by bit lines. The data I/O circuit 123 may store data transmitted from the outside, i.e., external to the memory device 120, to the memory cell array 121 or output the data stored in the memory cell array 121 to an external memory device (i.e., system-on-chip 110, and the like).

The clock control circuit 122 may output the internal data clock signal IWCK based on the data clock signal WCK. The clock control circuit 122 may output the internal data clock signal IWCK by adjusting a duty cycle and delay of the data clock signal WCK. The clock control circuit 122 may adjust the duty cycle and/or delay of the data clock signal WCK based on the first code and/or the second code received from the system-on-chip 110. The clock control circuit 122 may include a duty cycle adjustment circuit (e.g., duty cycle adjustment (DCA) and a duty cycle corrector (DCC)). The duty cycle adjustment circuit may adjust the duty cycle of the data clock signal WCK according to the first code and output the data clock signal WCK of which the duty cycle is adjusted. The clock control circuit 122 may include a slew rate adjustment circuit. The slew rate adjustment circuit may adjust a slew rate of the signal output from the duty cycle adjustment circuit and output it as an internal data clock signal IWCK.

The data I/O circuit 123 may output the DQ and/or DQS based on the internal data clock signal IWCK. The data I/O circuit 123 may output a plurality of training patterns as the DQ and/or DQS based on the internal data clock signal IWCK. The data I/O circuit 123 may output inverted training patterns based on the internal data clock signal IWCK. For example, the data I/O circuit 123 may output a first training pattern to the DQS at an edge of the internal data clock signal IWCK, and output an inverted pattern of the first training pattern to the DQSB at an edge of the internal data clock signal IWCK.

Figure 2:
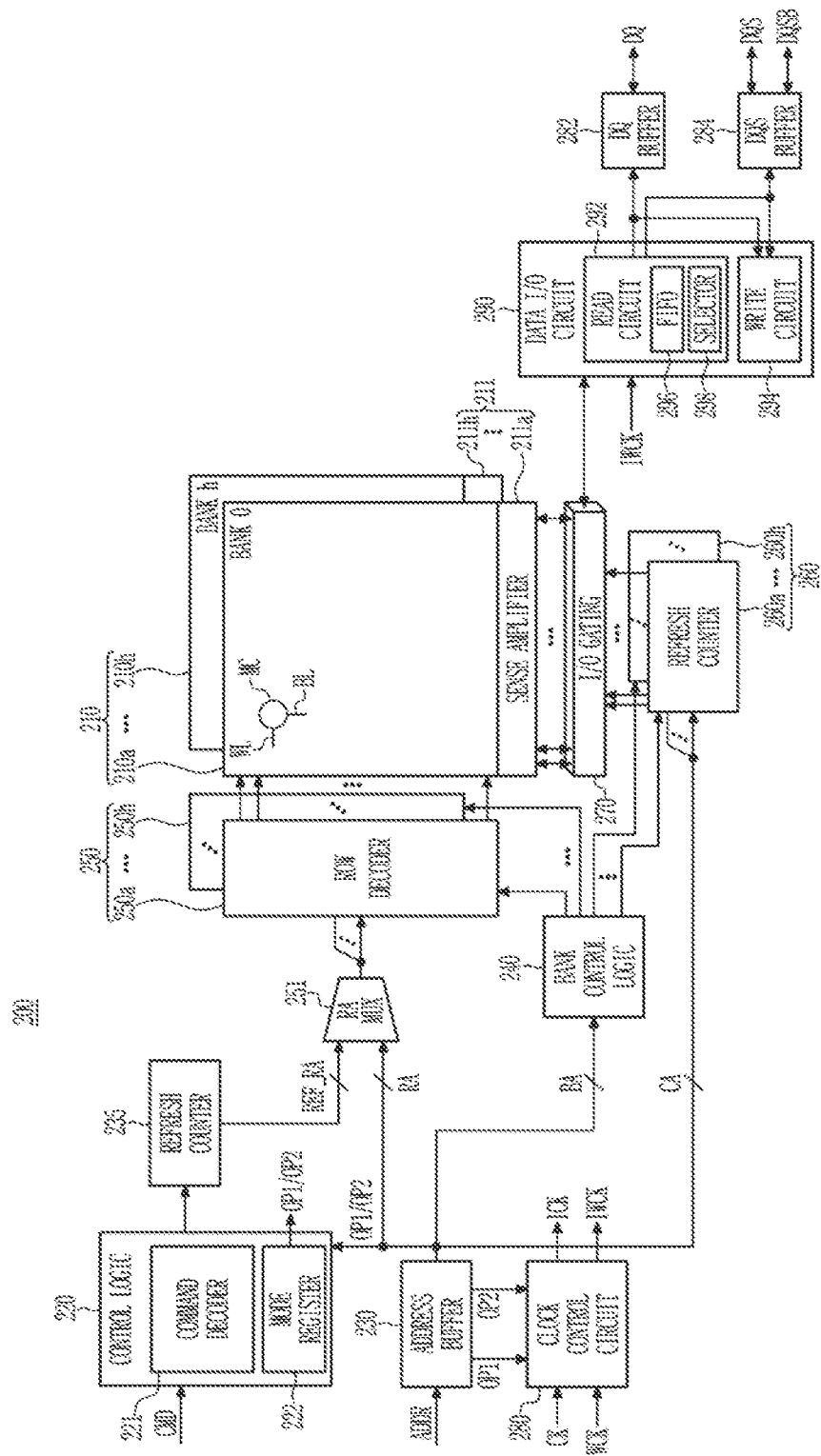
FIG. 2 is a block diagram of a semiconductor memory device according to an embodiment.

FIG. 2 is a block diagram of a semiconductor memory device according to an embodiment.

Referring to FIG. 2, a memory device 200 includes a memory cell array 210, a sense amp 211, a control logic circuit 220, an address buffer 230, a row decoder 250, a column decoder 260, an I/O gating circuit 270, a clock control circuit 280, and a data I/O circuit 290.

The memory cell array 210 includes a plurality of memory cells MC. In some embodiments, the memory cell array 210 may include a plurality of memory banks 210a to 210h. In FIG. 2, although eight memory banks BANK0 to BANK7 210a to 210h are shown, the number of memory banks is not limited thereto. Each of the memory banks 210a to 210h may include a plurality of rows, a plurality of columns, and a plurality of memory cells MC arranged at intersections of the plurality of rows and the plurality of columns. In some embodiments, a plurality of rows may be defined by a plurality of word lines WL, and a plurality of columns may be defined by a plurality of bit lines BL.

The control logic circuit 220 controls the operation of the memory device 200. For example, the control logic circuit 220 may generate a control signal such that the memory device 200 performs a read operation, a write operation, an offset calibration operation, and the like. In some embodiments, the control logic circuit 220 may include a command decoder 221. The command decoder 221 may generate a control signal by decoding the command signal CMD received from a system-on-chip (e.g., 110 of FIG. 1). The command decoder 221 may decode a command output from the system-on-chip 110 and may control internal constituent elements of the memory device 200. For example, the command decoder 221 may decode an activation command, a read command, a write command, a precharge command, a mode register write command, a multi-purpose command (MPC), and the like. All of the above-described commands may be determined in advance in the JEDEC standard.

In some embodiments, the control logic circuit 220 may further include a mode register 222 for setting an operation mode of the memory device 200. The mode register 222 may store a code provided from the address buffer 230. The number of mode registers 222, address, code size, and the like may be defined in the JEDEC standard. The system-on-chip 110 may change the values stored in the mode register 222 and set the operation conditions and operation mode of the memory device 200 by issuing a mode register write command and code.

The address buffer 230 receives the address ADDR provided from the system-on-chip 110. The address ADDR includes a row address RA indicating a row of the memory cell array 210 and a column address CA indicating a column of the memory cell array 210. The row address RA is provided to the row decoder 250, and the column address CA is provided to the column decoder 260. In some embodiments, the row address RA may be provided to the row decoder 250 through a row address multiplexer 251. In some embodiments, the address ADDR may further include a bank address BA indicating a memory bank. The bank address BA may be provided to a bank control logic 240.

The address buffer 230 may provide an address received with the mode register write command from the system-on-chip 110 to the mode register 222 and/or clock control circuit 280 as codes OP1 and OP2. Here, the codes OP1 and OP2 may be transmitted through command and address transmission paths between the system-on-chip 110 and the memory device 200. Since the codes OP1 and OP2 are stored in the mode register 222, they may be referred to as operation codes OPCODE or operands.

In some embodiments, the memory device 200 may further include the bank control logic 240 for generating a bank control signal in response to the bank address BA. The bank control logic 240 activates a row decoder 250 corresponding to the bank address BA among the plurality of row decoders 250 and a column decoder 260 corresponding to the bank address BA among the plurality of column decoders 260 in response to the bank control signal.

In some embodiments, the memory device 200 may further include a row address multiplexer 251. The row address multiplexer 251 may receive the row address RA from the address buffer 230 and a row address to be refreshed REF_RA from the refresh counter 235. The row address multiplexer 251 may selectively output the row address RA received from the address buffer 230 and the row address REF_RA received from the refresh counter 235 to the row decoder 250.

The row decoder 250 selects a row to be activated from the plurality of rows of the memory cell array 210 based on the row address. To this end, the row decoder 250 may apply a driving voltage to a word line corresponding to a row to be activated. In some embodiments, a plurality of row decoders 250a to 250h corresponding to the plurality of memory banks 210a to 210h may be provided.

The column decoder 260 selects a column to be activated from the plurality of columns of the memory cell array 210 based on the column address. To this end, the column decoder 260 may activate the sense amp 211 corresponding to the column address CA through the I/O gating circuit 270. In some embodiment, a plurality of column decoders 260a to 260h corresponding to the plurality of memory banks 210a to 210h, respectively, may be provided. In some embodiments, the I/O gating circuit 270 gates input/output data, and may include a data latch for storing data read from the memory cell array 210 and a write driver for writing data to the memory cell array 210. The data read from the memory cell array 210 may be sensed by the sense amp 211 and stored in the I/O gating circuit 270 (for example, a data latch). In some embodiments, a plurality of sense amps 211a to 211h corresponding to the plurality of memory banks 210a to 210h, respectively, may be provided.

In some embodiments, data read from the memory cell array 210 (e.g., data stored in the data latch) may be provided to the system-on-chip 110 through the data I/O circuit 290. Data to be written into the memory cell array 210 may be provided from the system-on-chip 110 to the data I/O circuit 290, and the data provided to the data I/O circuit 290 may be provided to the I/O gating circuit 270.

The clock control circuit 280 may receive a system clock signal CK and a data clock signal WCK. The clock control circuit 280 may generate an internal clock signal ICK by buffering the system clock signal CK. The phase of the buffered internal clock signal ICK may be almost the same as the phase of the clock signal CK. In some embodiments, the clock control circuit 280 may generate the internal clock signal ICK by dividing the clock signal CK. In an embodiment, the clock control circuit 280 may generate the internal data clock signal IWCK using the data clock signal WCK. The clock control circuit 280 may adjust a duty cycle and/or delay of the data clock signal WCK by using a first code OP1 and/or a second code OP2. The clock control circuit 280 may include a duty cycle adjustment circuit and a slew rate adjustment circuit. The duty cycle adjustment circuit may adjust a duty cycle of the data clock signal WCK based on the first code OP1. The slew rate adjustment circuit may adjust a delay of the data clock signal WCK based on the second code OP2. The clock control circuit 280 may output the internal clock signal ICK and an internal data clock signal IWCK.

A DQ buffer 282 may receive a write DQ from the system-on-chip 110 or output a read DQ to the system-on-chip 110. Since the DQ is a bi-directional signal, the DQ buffer 282 may include both a receiver (not shown) for receiving the write DQ and a transmitter (not shown) for outputting the read DQ. The DQS buffer 284 may receive the write DQS and/or write DQSB from the system-on-chip 110 or output the read DQS and/or read DQSB to the system-on-chip 110. Since the DQS is a bi-directional signal, the DQS buffer 284 may include both a receiver (not shown) for receiving the write DQS and a transmitter (not shown) for outputting the read DQS.

The data I/O circuit 290 may include a read circuit 292 and a write circuit 294. The read circuit 292 may receive read data from an input/output sense amp 211. The read circuit 292 may store the received read data in a first-in first-out (FIFO) 296. The read circuit 292 may serialize the read data and transmit the read DQS and the read DQ to the system-on-chip 110 through the DQ buffer 282 and the DQS buffer 284. The read circuit 292 may operate based on the internal data clock signal IWCK. In some embodiments, the read circuit 292 may transmit a plurality of first test patterns stored in the FIFO 296 to the system-on-chip 110 through the DQ buffer 282 and the DQS buffer 284. A selector 298 may serialize and output the first test pattern stored in the FIFO 296 at an edge of the internal data clock signal IWCK. The write circuit 294 may receive the write DQ and the write DQS from the system-on-chip 110 through the DQ buffer 282 and the DQS buffer 284. The write circuit 294 may sample or parallelize the write DQ using the write DQS and provide the sampling result to the write driver as write data. The write circuit 294 may operate based on the internal data clock signal IWCK.

Figure 3:
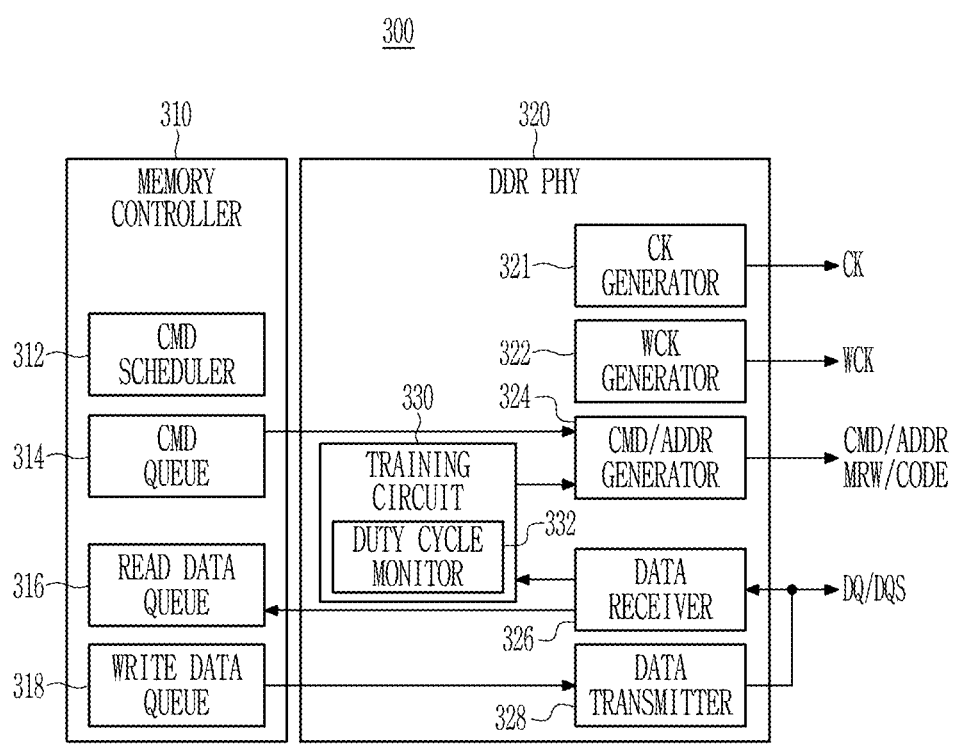
FIG. 3 is a block diagram of a system-on-chip according to an embodiment.

FIG. 3 is a block diagram of a system-on-chip according to an embodiment.

Referring to FIG. 3, a system-on-chip 300 may include a memory controller 310 and a double data rate (DDR) physical layer (PHY) 320. The memory controller 310 may control the memory device 200 (in FIG. 2) through the DDR PHY 320. The memory controller 310 may generate commands and addresses for accessing the memory device 200. The memory controller 310 may generate data to be stored in the memory device 200. The memory controller 310 may receive data stored in the memory device 200.

The DDR PHY 320 may also be referred to as a DDR PHY interface. The DDR PHY 320 may transmit a system clock signal CK, a data clock signal WCK, and a command CMD and address ADD to the memory device 200 based on the control of the memory controller 310. The DDR PHY 320 may transmit the DQ and the DQS to the memory device 200 based on the control of the memory controller 310. The DDR PHY 320 may receive the DQS and the DQ from the memory device 200. Paths used by the DDR PHY 320 to transmit the DQS and the DQ to the memory device 200 and paths used by the memory device 200 to transmit the DQS and the DQ to the DDR PHY 320 may be the same and may be shared.

The memory controller 310 may include a command scheduler 312, a command queue 314, a read data queue 316, and a write data queue 318. The command queue 314 may store commands and addresses issued by an external processor or the like. The command and address stored in the command queue 314 may be provided to the DDR PHY 320 based on the control of the command scheduler 312. In this case, at least one command and at least one address stored in the command queue 314 may be provided in parallel to the DDR PHY 320. The command scheduler 312 may adjust the order of commands and addresses stored in the command queue 314, the timing when the command(s) and address(es) are input to the command queue 314, and the timing when the command(s) and address(es) are output from the command queue 314.

The read data queue 316 may store read data transmitted from the memory device 200 through the DDR PHY 320 in response to a read request to the memory device 200 of the system-on-chip 300. The read data stored in the read data queue 316 may be processed by an external processor. The write data queue 318 may store write data to be stored in the memory device 200. The write data stored in the write data queue 318 by the write request to the memory device 200 of the system-on-chip 300 may be transmitted to the memory device 200 through the DDR PHY 320. For example, the command queue 314, the command scheduler 312, the read data queue 316, and the write data queue 318 of the memory controller 310 may be implemented in the system-on-chip 300 using a hardware method, a software method, or a combination thereof.

The DDR PHY 320 may include a clock generator 321, a data clock generator 322, a command and address generator 324, a data receiver 326, a data transmitter 328, and a training circuit 330. The clock generator 321, the data clock generator 322, the command and address generator 324, the data receiver 326, the data transmitter 328, and the training circuit 330 of the DDR PHY 320 may be implemented in the system-on-chip 300 by using a hardware method, a software method, or a combination thereof.

The clock generator 321 may generate a system clock signal CK that is output to the memory device 200. The data clock generator 322 may generate a data clock signal WCK output to the memory device 200. Although it is not illustrated in FIG. 3, the clock generator 321 may include a DCC or DCA for adjusting a duty cycle of the system clock signal CK. The data clock generator 322 may also include a DCC or DCA that adjusts a duty cycle of the data clock signal WCK.

The command and address generator 324 may receive a command or address from the command queue 314 and transmit the command or address to the memory device 200. For example, the number of command and address transmission paths between the command and address generator 324 and the memory device 200, logical states of signals transmitted through the above-described transmission paths, a transmission method, and the like will be defined in the JEDEC standard of the memory device 200.

The data receiver 326 may receive read data from the memory device 200. The data receiver 326 may provide the received read data to the read data queue 316. The data receiver 326 may align the read DQS and read DQ or adjust the skew between the read DQS and read DQ. The data receiver 326 may include a delay locked loop DLL including a plurality of delay cells. For example, the read data receiver 326 may search for the optimal sampling point for determining the read DQ in the system-on-chip 300 while delaying the read DQS or read DQ based on a time unit delayed by one delay cell.

The data transmitter 328 may receive write data from the write data queue 318. The data transmitter 328 may transmit the received write data to the memory device 200. The data transmitter 328 may align the write DQS and the write DQ or adjust the skew between the write DQS and the write DQ. The data transmitter 328 may also include a DLL including a plurality of delay cells. The data transmitter 328 may search for an optimal sampling point for determining the write DQ in the memory device 200 while delaying the write DQS or the write DQ based on a time unit delayed by one delay cell.

The training circuit 330 may control the command and address generator 324 based on the control of the training program. For example, the command and address generator 324 may generate a read command, a write command, and the like for training by a training program and transmit it to the memory device 200.

Specifically, the training circuit 330 may control the command and address generator 324 such that the command and address generator 324 outputs a mode register write MRW command and code CODE to the memory device 200. The training circuit 330 may provide a value of the code CODE to the command and address generator 324. The mode register write command may be a command to write a code to the mode register (222 of FIG. 2) of the memory device 200. The training circuit 330 may set the duty cycle and/or delay of the internal data clock signal IWCK output by the clock control circuit 280 by changing the value of the code stored in the mode register 222 of the memory device 200 through the mode register write command.

In an embodiment, the training circuit 330 may receive the read DQS and the read DQ of the data receiver 326. The training circuit 330 may change the value of code CODE based on the read DQS and/or the read DQ. The training circuit 330 may include a duty cycle detector 332. The duty cycle detector 332 may monitor the duty cycle of the read DQS and/or the read DQ. In an embodiment, the duty cycle detector 332 may detect whether the duty cycle of the read DQS and/or the read DQ is greater than or equal to the duty cycle reference value. The training circuit 330 may determine a final value of the code based on the code CODE output when the duty cycle of the read DQS and/or read DQ is greater than or equal to the duty cycle reference value.

According to an embodiment, the training circuit 330 may perform clock training of the memory device 200 based on the read DQS and read DQ of the data receiver 326. Since the training circuit 330 is positioned within the system-on-chip 300 rather than the memory device 200, the training circuit 330 may determine an optimal duty cycle to which both the signal delay and the slew rate according to a physical interface between the memory device 200 and the system-on-chip 300 are reflected.

Figure 4:
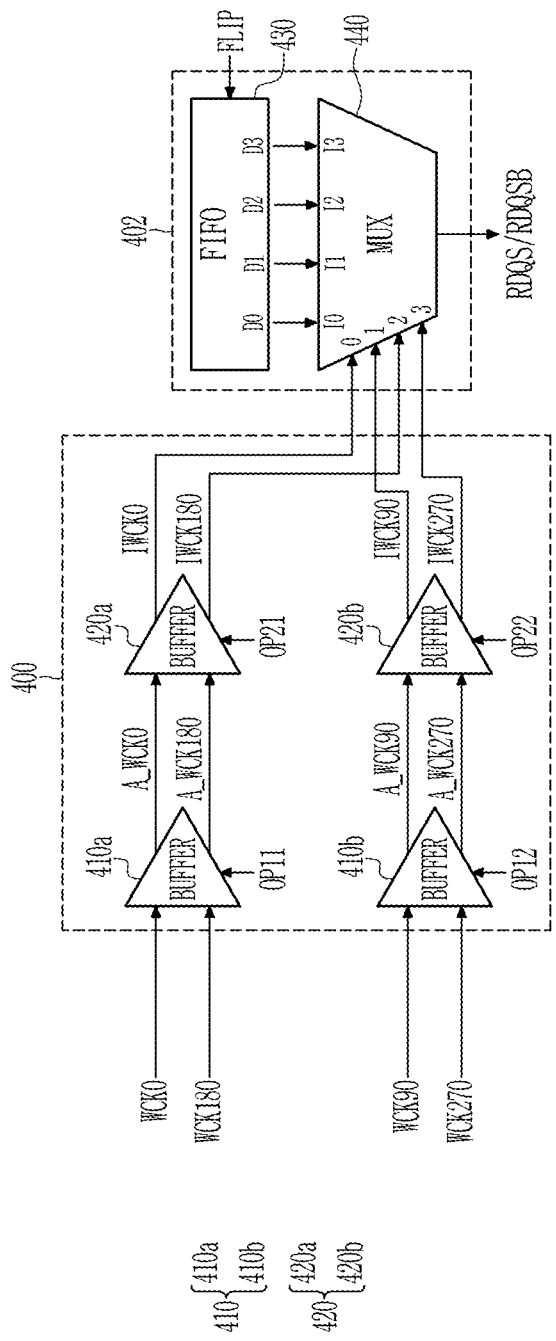
FIG. 4 is a block diagram of a clock control circuit and a read circuit according to an embodiment.

FIG. 4 is a block diagram of a clock control circuit and a read circuit according to an embodiment.

Referring to FIG. 4, a clock control circuit 400 may include a first buffer 410 and a second buffer 420. The clock control circuit 400 may output a plurality of data clock signals WCK0, WCK180, WCK90, and WCK270 as a plurality of internal data clock signals IWCK0, IWCK90, IWCK180, and IWCK270. The plurality of data clock signals WCK0, WCK180, WCK90, and WCK270 may have a phase difference of 90 degrees from each other.

The first buffer 410 may receive complementary data clock signals WCK0 and WCK180 or WCK90 and WCK270 and adjust a duty cycle of the data clock signals WCK0 and WCK180 or WCK90 and WCK270 to output adjusted data clock signals A_WCK0 and A_WCK180 or A_WCK90 and A_WCK270. The first buffer 410 may adjust the duty cycle of data clock signals WCK0 and WCK180 or WCK90 and WCK270 according to a first code OP11 or OP12. In some embodiments, the first buffer 410 may be a DCA.

Table 1 illustrates example steps in which the first buffer 410a adjusts the duty cycle of data clock signals WCK0 and WCK180 according to the value of the first code OP11[n:0] (here, n is a natural number). In Table 1, the type of DCA is "W", and W indicates writing to the mode registers 222. In Table 1, the first code OP11[n:0] may be formed of 4 bits, but the present invention is not limited thereto.

When a value of the code OP11[3:0] "0000b", the first buffer 410a may not adjust the duty cycle of data clock signals WCK0 and WCK180. When the value of code OP11[3:0] is changed to one of the values from "0001b" to "111b", the first buffer 410a may reduce the duty cycle of the data clock signal WCK0 by an operation corresponding to the value of the code OP11[3:0]. Here, the data clock signal WCK180 is complementary to the data clock signal WCK0. The first buffer 410a may adjust the duty cycle of data clock signals WCK0 and WCK180 from the −1 operation to the −7 operation. Similarly, when the value of the code OP11[3:0] is changed to one of the values from "1001b" to "1111b", the first buffer 410a may include the duty cycle of the data clock signal WCK0 as much as an operation corresponding to the value of the code OP11[3:0]. The first buffer 410a may adjust the duty cycle of data clock signals WCK0 and WCK180 from the operation +1 to the operation +7. The size of the unit operation in Table 1 may be determined in advance. The second buffer 420 may receive the complementary adjusted data clock signals A_WCK0 and A_WCK180 or A_WCK90 and A_WCK270 and adjust the delay of the adjusted data clock signals A_WCK0 and A_WCK180 or A_WCK90 and A_WCK270 to output the as the internal data clock signals IWCK0 and IWCK180 or IWCK90 and IWCK270. The second buffer 420 may adjust the delay of data clock signals WCK0 and WCK180 or WCK90 and WCK270 according to a second code P21 or OP22. In some embodiments, the second buffer 420 may include CML to CMOS amplifier. In some embodiments, the second buffer 420 may adjust the delay of the data clock signals WCK0 and WCK180 or WCK90 and WCK270 by controlling the slew rate of the input adjusted data clock signals A_WCK0 and A_WCK180 or A_WCK90 and A_WCK270.

Table 2 illustrates example steps in which the second buffer 420a adjusts the delay of the adjusted data clock signals A_WCK0 and A_WCK180 according to a value of the second code OP21[n:0] (here, n is a natural number). In Table 2, the type of DELAY is "W". In Table 2, the second code OP21[n:0] may be formed of 4 bits, but the present invention is not limited thereto.

TABLE 1

| Function | Type | OP11 | Data |
|---|---|---|---|
| DCA | W | OP11[3:0] | 0000b: 0 Steps (Default) |
| | | | 0001b: −1 Steps |
| | | | 0010b: −2 Steps |
| | | | 0011b: −3 Steps |
| | | | 0100b: −4 Steps |
| | | | 0101b: −5 Steps |
| | | | 0110b: −6 Steps |
| | | | 0111b: −7 Steps |
| | | | 1000b: RFU |
| | | | 1001b: +1 Steps |
| | | | 1010b: +2 Steps |
| | | | 1011b: +3 Steps |
| | | | 1100b: +4 Steps |
| | | | 1101b: +5 Steps |
| | | | 1110b: +6 Steps |
| | | | 1111b: +7 Steps |

TABLE 2

| Function | Type | OP21 | Data |
|---|---|---|---|
| DELAY | W | OP21[3:0] | 0000b: 0 Steps (Default) |
| | | | 0001b: −1 Steps |
| | | | 0010b: −2 Steps |
| | | | 0011b: −3 Steps |
| | | | 0100b: −4 Steps |
| | | | 0101b: −5 Steps |
| | | | 0110b: −6 Steps |
| | | | 0111b: −7 Steps |
| | | | 1000b: RFU |
| | | | 1001b: +1 Steps |
| | | | 1010b: +2 Steps |
| | | | 1011b: +3 Steps |
| | | | 1100b: +4 Steps |
| | | | 1101b: +5 Steps |
| | | | 1110b: +6 Steps |
| | | | 1111b: +7 Steps |

When the value of the code OP21[3:0] is "0000b", the second buffer 420a may not adjust the delay of the adjusted data clock signals A_WCK0 and A_WCK180. When the value of the code OP21[3:0] is changed to one of the values from "0001b" to "0111b", the second buffer 420a may reduce the delay of the data clock signals A_WCK0 and A_WCK180 by as much as an operation corresponding to the value of the code OP21[3:0]. The second buffer 420a may adjust the delay of the adjustable data clock signals A_WCK0 and A_WCK180 from the operation −1 to the operation −7. Similarly, when the value of code OP21[3:0] is changed to one of the values "1001b" to "1111b", the second buffer 420a may increase the delay of the data clock signals (A_WCK0 and A_WCK180) by as much as an operation corresponding to the value of the code OP21[3:0]. The second buffer 420a may adjust the delay of the adjusted data clock signals A_WCK0 and A_WCK180 from the operation +1 to the operation +7. The size of the unit operation in Table 2 may be determined in advance. The read circuit 402 may serialize the first test pattern in synchronization with the internal data clock signals IWCK0 and IWCK180 or IWCK90 and IWCK270 transmitted from the clock control circuit 400 to output a read DQS RDQS and/or a read DQSB RDQSB. The read circuit 402 may include a FIFO 430 and a selector 440.

The FIFO 430 may output the stored first test pattern to a selector (MUX) 440. The FIFO 430 may transmit the first test patterns D0, D1, D2, and D3 to the selector 440 as is, or transmit the second test pattern D0, D1, D2, and D3 to the selector 440 according to a control signal FLIP. At predetermined timing after a read command for training and the like is received from the training circuit 330 (in FIG. 3), the command decoder 221 (in FIG. 2) may provide the control signal FLIP to the FIFO 430.

The selector 440 may serialize and output the first test patterns D0, D1, D2, and D3 or the second test patterns D0, D1, D2, and D3 provided to input ends I0, I1, I2, and I3 as a read DQS RDQS or a inverted read DRQS RDQSB at an edge of the internal data clock signals IWCK0, IWCK90, IWCK180, and IWCK270. For example, the selector 440 may output data provided to the input end I0 as the read DQS RDQS at a rising edge at which the internal data clock signal IWCK0 is changed from a low level to a high level. The selector 440 may output the data provided to the input end I1 as the read DQS RDQS at a rising edge at which the internal data clock signal IWCK90 is changed from the low level to the high level. The selector 440 may output the data provided to the input end I2 as the read DQS RDQS at a rising edge at which the internal data clock signal IWCK180 is changed from the low level to the high level. The selector 440 may output the data provided to the input end I3 as the read DQS RDQS at a rising edge at which the internal data clock signal IWCK270 is changed from the low level to the high level. In the following description, it will be described that the selector 440 outputs a read DQS RDQS or a inverted read DRQS RDQSB on the rising edge of internal data clock signals IWCK0, IWCK90, IWCK180, and IWCK270, but the present invention is not limited thereto. The selector 440 may output a read DQS RDQS or a inverted read DRQS RDQSB on the falling edge or both rising and falling edges of the internal data clock signals IWCK0, IWCK90, IWCK180, and IWCK270, and accordingly, the values of the first test pattern and/or the second test pattern input to the selector 440 may be changed.

The signals RDQS and RDQSB output by the read circuit 402 according to the internal data clock signals IWCK0, IWCK90, IWCK180, and IWCK270 output by the clock control circuit 400 will be described with reference to FIG. 5 to FIG. 12.

Figure 5:
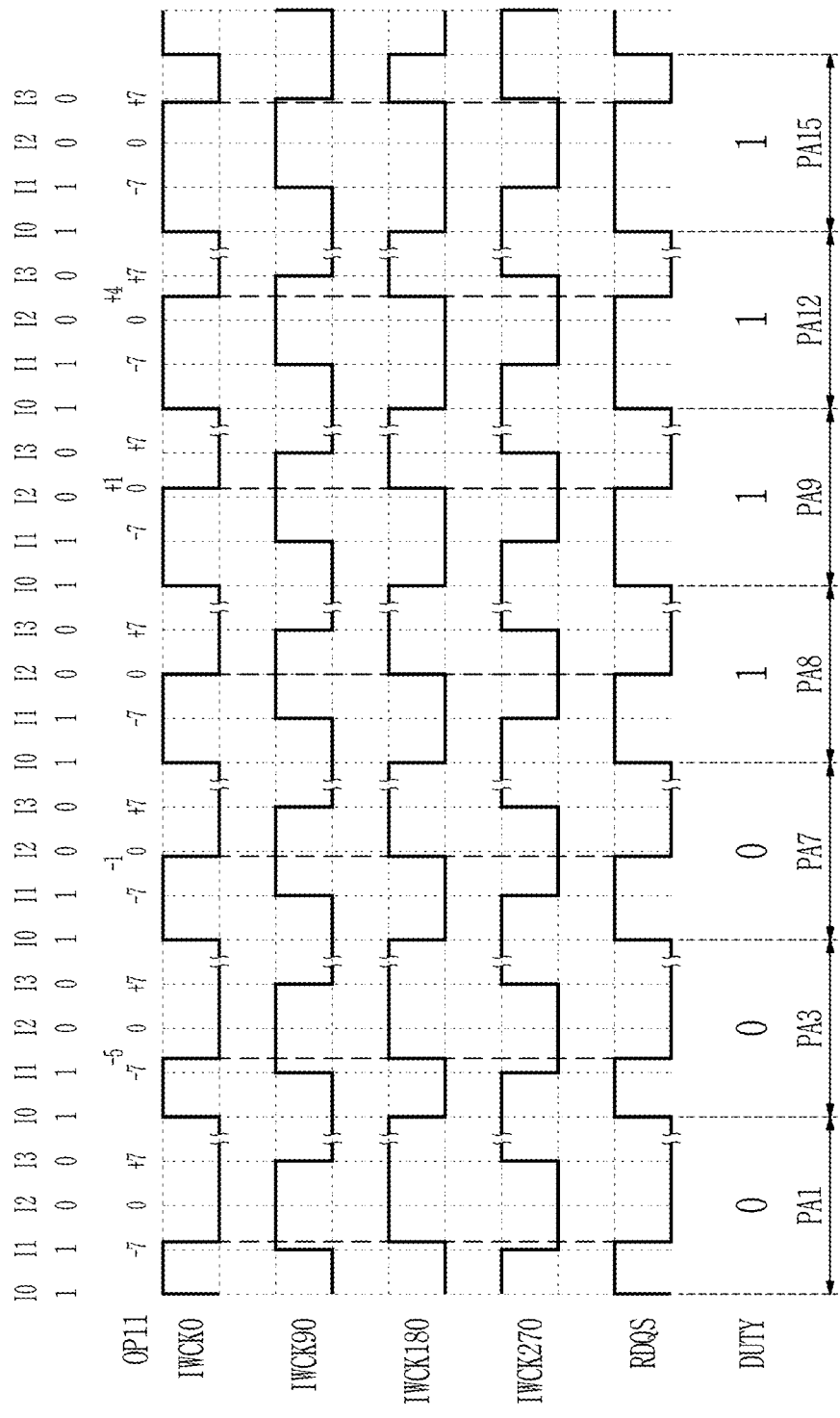
FIG. 5 and FIG. 6 are graphs that illustrate waveforms of input and output signals of a clock control circuit and a read circuit.
Figure 6:
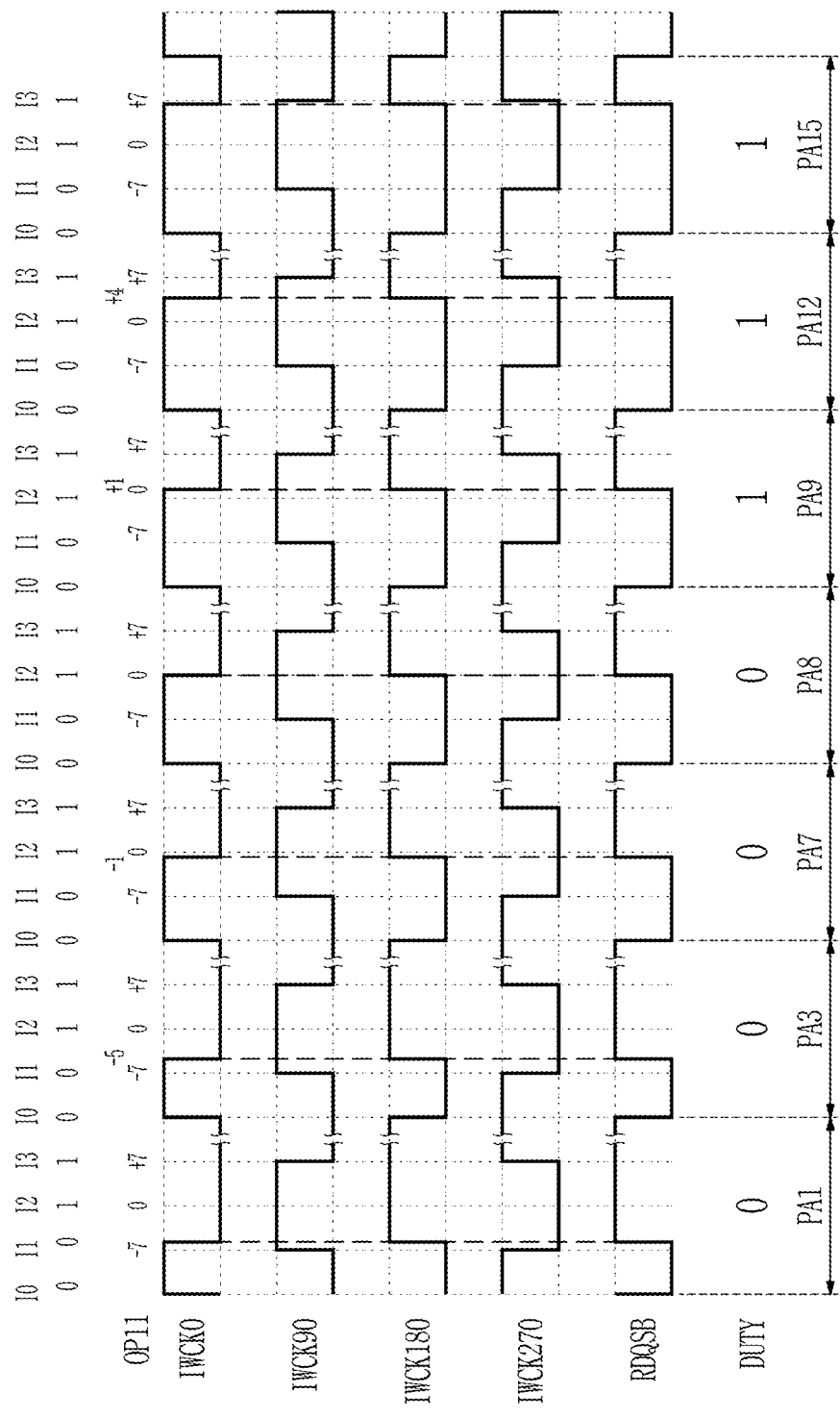

FIG. 5 and FIG. 6 are graphs that illustrate waveforms of input/output signals of the clock control circuit and the read circuit.

Referring to FIG. 5, "1100" may be provided as the first test patterns D0, D1, D2, and D3 to the input ends I0, I1, I2, and I3. The selector may output the "1100" output to the input ends I0, I1, I2, and I3 as the read DQS RDQS at rising edges of the internal data clock signals IWCK0, IWCK90, IWCK180, and IWCK270. At the rising edge of the internal data clock signal IWCK0, a logic value "1" of the first test pattern D0 provided to the input end I0 may be output as the read DQS RDQS. At the rising edge of the internal data clock signal IWCK90, a logic value "1" of the first test pattern D1 provided to the input end I1 may be output as the read DQS RDQS. At the rising edge of the internal data clock signal IWCK180, a logic value "0" of the first test pattern D2 provided to the input end I3 may be output as the read DQS RDQS. At the rising edge of the internal data clock signal IWCK270, a logic value "0" of the first test pattern D3 provided to the input end I1 may be output as the read DQS RDQS.

The first code OP11 may be provided to the first buffer 410a of the clock control circuit 400. In each period PA1, ..., PA3, ..., PA7, PA8, PA9, ..., PA12, ..., and PA15, the system-on-chip 300 may adjust the first code OP11. Then, in each period PA1, ..., PA3, ..., PA7, PA8, PA9, ..., PA12, ..., and PA15, the clock control circuit 400 may adjust the duty cycle of data clock signals WCK0 and WCK180 with steps −7, ..., −5 ..., −1, 0, 1, ..., 4, ..., and 7, and output them as the internal data clock signals IWCK0 and IWCK180. The read circuit 402 may output read DQS RDQS according to the internal data clock signals IWCK0 and IWCK180 of which the duty cycles are adjusted. The system-on-chip 300 may receive the read DQS RDQS of the memory device 200 and determine whether the duty cycle of the read DQS RDQS is equal to or greater than the duty cycle reference value. Since the duty cycle of the read DQS RDQS in the first to seventh periods PA1, ..., and PA7 is less than the duty cycle reference value, the system-on-chip 300 may determine the duty DUTY as a logic value "0". Since the duty cycle of the read DQS RDQS in the eighth period to the fifteenth period PA8, ..., and PA15 is greater than or equal to the duty cycle reference value, the system-on-chip 300 may determine the duty DUTY as a logic value "1".

Referring to FIG. 6, second test patterns D0, D1, D2, and D3 "0011" inverted from the first test patterns D0, D1, D2, and D3 "1100" may be provided to the input ends I0, I1, I2, and I3 according to the control signal FLIP. The selector 440 may output "0011" provided to the input ends I0, I1, I2, and I3 as a read DQSB RDQSB on the rising edge of the internal data clock signals IWCK0, IWCK90, IWCK180, and IWCK270. At the rising edge of the internal data clock signal IWCK0, the logic value "0" of the first test pattern D0 provided to the input end I0 may be output to the read DQSB RDQSB. At the rising edge of the internal data clock signal IWCK90, the logic value "0" of the first test pattern D1 provided to the input end I1 may be output to the read DQSB RDQSB. At the rising edge of the internal data clock signal IWCK180, the logic value "1" of the first test pattern D2 provided to the input end I2 may be output to the read DQSB RDQSB. At the rising edge of the internal data clock signal IWCK270, the logic value "1" of the first test pattern D3 provided to the input end I3 may be output to the read DQSB RDQSB. The system-on-chip 300 may receive the read DQSB RDQSB of the memory device 200 and determine whether the duty cycle of the read DQSB RDQSB is equal to or greater than a duty cycle reference value. Since the duty cycle of the read DQSB RDQSB in the first period to eighth period PA1, . . . , and PA8 is less than the duty cycle reference value, the system-on-chip 300 may determine the duty DUTY as a logic value "0". Since the duty cycle of the read DQSB RDQSB in the ninth period to the fifteenth period PA9, . . . , and PA15 is greater than or equal to the duty cycle reference value, the system-on-chip 300 may determine the duty DUTY as a logic value "1". In FIG. 5 and FIG. 6, the first code OP11 is sequentially increased from the operation −7 to the operation +7, but the method of the system-on-chip 300 for adjusting the first code OP11 is not limited thereto.

Next, referring to FIG. 7 and FIG. 8, a method for the system-on-chip 300 to determine a final value OP11 of the first code will be described.

FIG. 7 and FIG. 8 are tables illustrating the code for adjusting the duty cycle of the internal data clock signal according to an embodiment.

The system-on-chip 300 may determine the final value OP11 of the first code based on the duty DUTY according to the first code OP11 of the first test pattern and the duty DUTY according to the first code OP11 of the second test pattern. The system-on-chip 300 may determine the final value OP11 of the first code based on the value of the first code OP11 in which the DUTY is changed. In some embodiments, the system-on-chip 300 may determine the final value OP11 of the first code with a middle value of the first code OP11 of which the duty DUTY is changed according to the output of the first test pattern, and the first code OP11 of which the duty DUTY is changed according to the output of the second test pattern.

Referring to FIG. 7, since the duty DUTY determined according to the output of the first test pattern was changed between the −1 operation and the 0 operation and the duty DUTY determined according to the output of the second test pattern was changed between the 0 operation and the 1 operation, the system-on-chip 300 may determine the final value of the first code OP11 as a value indicating operation 0, which is an intermediate value between the operation −1 and the operation 1.

Referring to FIG. 8, since the duty DUTY determined according to the output of the first test pattern changed between the operation 4 and the operation 5, and the duty DUTY determined according to the output of the second test pattern changed between the operation 1 and the operation 2, the system-on-chip 300 may determine the final value of the first code OP11 as a value indicating the operation 3, which is an intermediate value between the operation 1 and the operation 5.

The system-on-chip 300 may provide the first code OP11 for controlling the first buffer 410*a* to the memory device 200, and determine the final value OP11 of the first code based on the read DQS and the read DQSB input from the memory device 200. Accordingly, the system-on-chip 300 may train the internal data clock signals IWCK0 and IWCK180 such that the internal data clock signals IWCK0 and IWCK180 have phases that are exactly complementary to each other.

Figure 9:
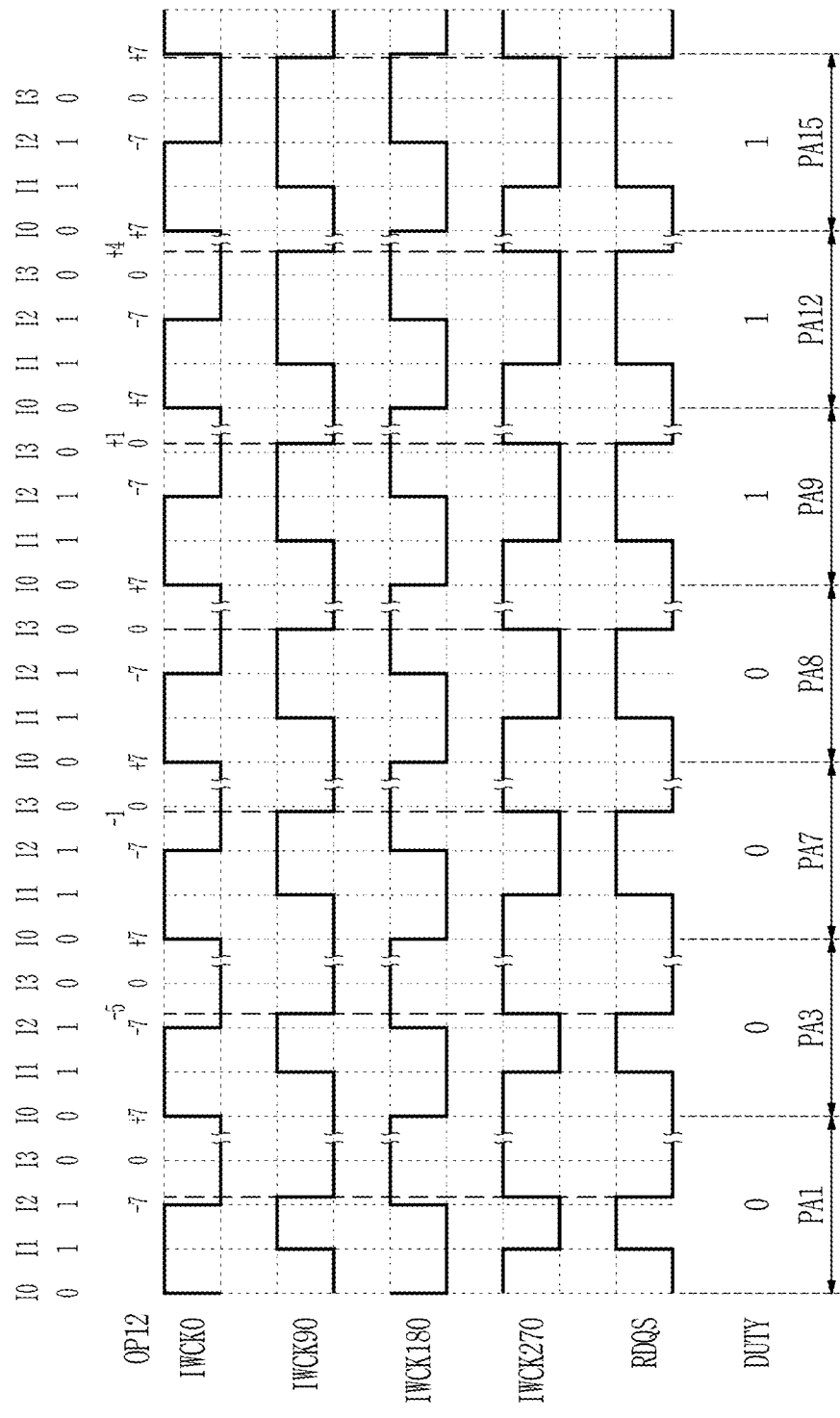
FIG. 9 and FIG. 10 are graphs that illustrate waveforms of input and output signals of a clock control circuit and a read circuit.
Figure 10:
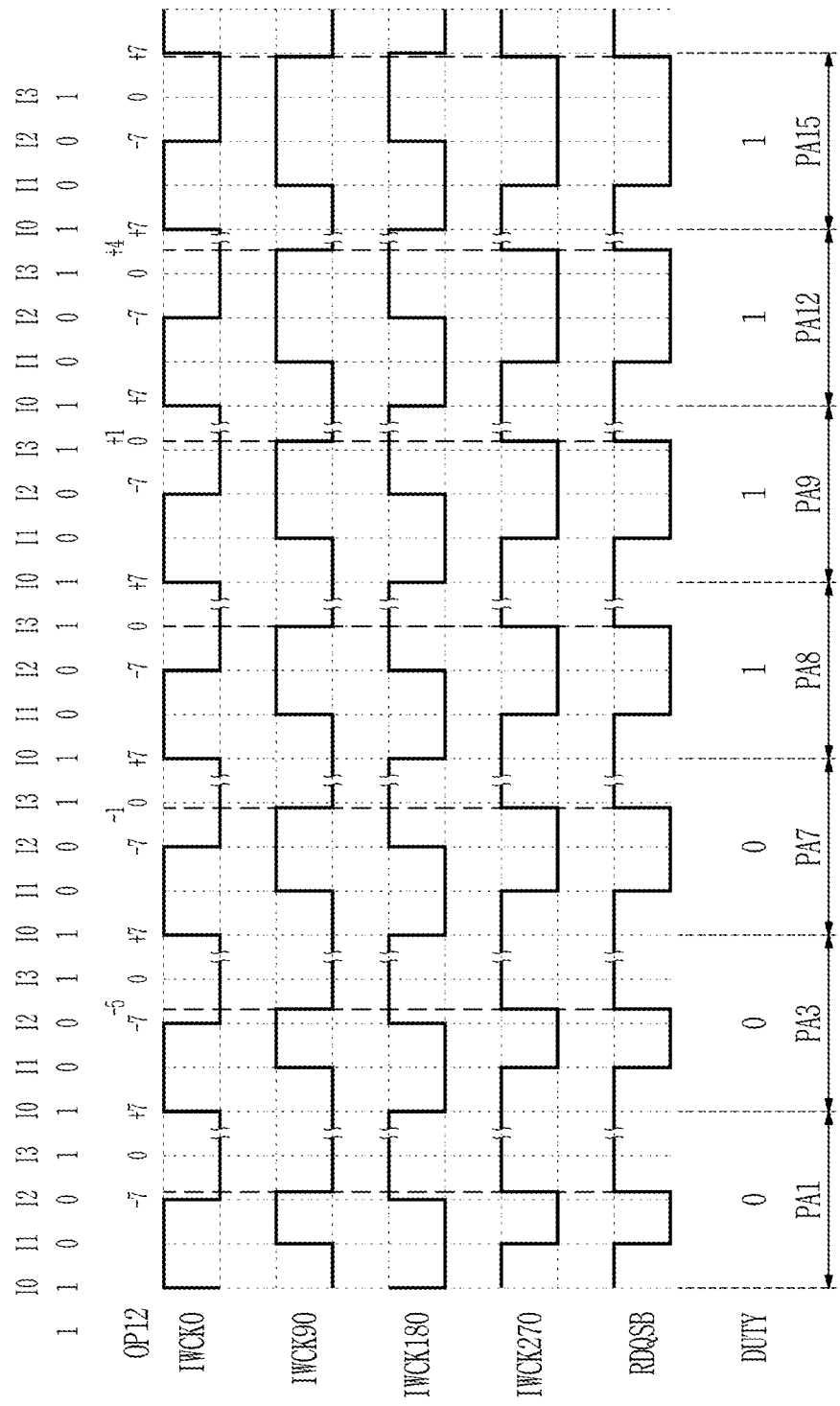

FIG. 9 and FIG. 10 are graphs illustrating the waveforms of the input and output signals of the clock control circuit and the read circuit.

Referring to FIG. 9, the first test patterns D0, D1, D2, and D3 "0110" may be provided to the input ends I0, I1, I2, and I3. The selector 440 may output "0110" provided to the input ends I0, I1, I2, and I3 as the read DQS RDQS on the rising edge of internal data clock signals IWCK0, IWCK90, IWCK180, and IWCK270.

A first code OP12 may be provided to the first buffer 410*a* of the clock control circuit 400. In each period PA1, . . . , PA3, . . . , PA7, PA8, PA9, . . . , PA12, . . . , and PA15, the system-on-chip 300 may adjust the first code OP12. Then, in each period PA1, . . . , PA3, . . . , PA7, PA8, PA9, . . . , PA12, . . . , and PA15, the clock control circuit 400 may adjust the duty cycle of the data clock signals WCK90 and WCK270 with the steps −7, . . . , −5, . . . , −1, 0, 1, . . . , 4, . . . , and 7, and output as the internal data clock signals IWCK90 and IWCK270. The read circuit 402 may output the read DQS RDQS according to the data clock signals IWCK90 and IWCK270 of which the duty cycle is adjusted. The system-on-chip 300 may receive the read DQS RDQS of the memory device 200 and determine whether the duty cycle of the read DQS RDQS is equal to or greater than a duty cycle reference value. Since the duty cycle of the read DQS RDQS in the first to eighth periods PA1, . . . , and PA8 is less than the duty cycle reference value, the system-on-chip 300 may determine the duty DUTY as a logic value "0". Since the duty cycle of the read DQS RDQS in the ninth period to the fifteenth period PA9, . . . , and PA15 is equal to or greater than the duty cycle reference value, the system-on-chip 300 may determine the duty DUTY as a logic value "1".

Referring to FIG. 10, second test patterns D0, D1, D2, and D3 "1001" inverted from the first test patterns D0, D1, D2, and D3 "0110" may be provided to the input ends I0, I1, I2, and I3 according to the control signal FLIP. The selector 440 may output "1001" provided to the input ends I0, I1, I2, and I3 as the read DQS RDQS on the rising edge of internal data clock signals IWCK0, IWCK90, IWCK180, and IWCK270. The system-on-chip 300 may receive the read DQSB RDQSB of the memory device 200 and determine whether the duty cycle of the read DQSB RDQSB is equal to or greater than the duty cycle reference value. Since the duty cycle of the read DQSB RDQSB in the first period to the seventh period PA1, . . . , and PA7 is less than the duty cycle reference value, the system-on-chip 300 may determine the duty DUTY as a logic value "0". Since the duty cycle of the read DQSB RDQSB in the eighth period to the fifteenth period PA8, . . . , and PA15 is greater than or equal to the duty cycle reference value, the system-on-chip 300 may determine the duty DUTY as a logic value "1". In FIG. 9 and FIG. 10, it is described that the first code OP12 sequentially increases from the −7 operation to the +7 operation, but the manner in which the system-on-chip 300 adjusts the first code OP12 is not limited thereto.

The system-on-chip 300 may determine the final value OP12 of the first code based on the duty DUTY according to the first code OP12 of the first test pattern and the duty DUTY according to the first code OP12 of the second test pattern.

The system-on-chip 300 may provide the first code OP12 for controlling the first buffer 410*a* to the memory device 200, and determine the final value OP12 of the first code based on the read DQS and the read DQSB input from the memory device 200. Accordingly, the system-on-chip 300 may train the internal data clock signals IWCK90 and IWCK270 such that the internal data clock signals IWCK90 and IWCK270 have phases that are exactly complementary to each other.

Figure 11:
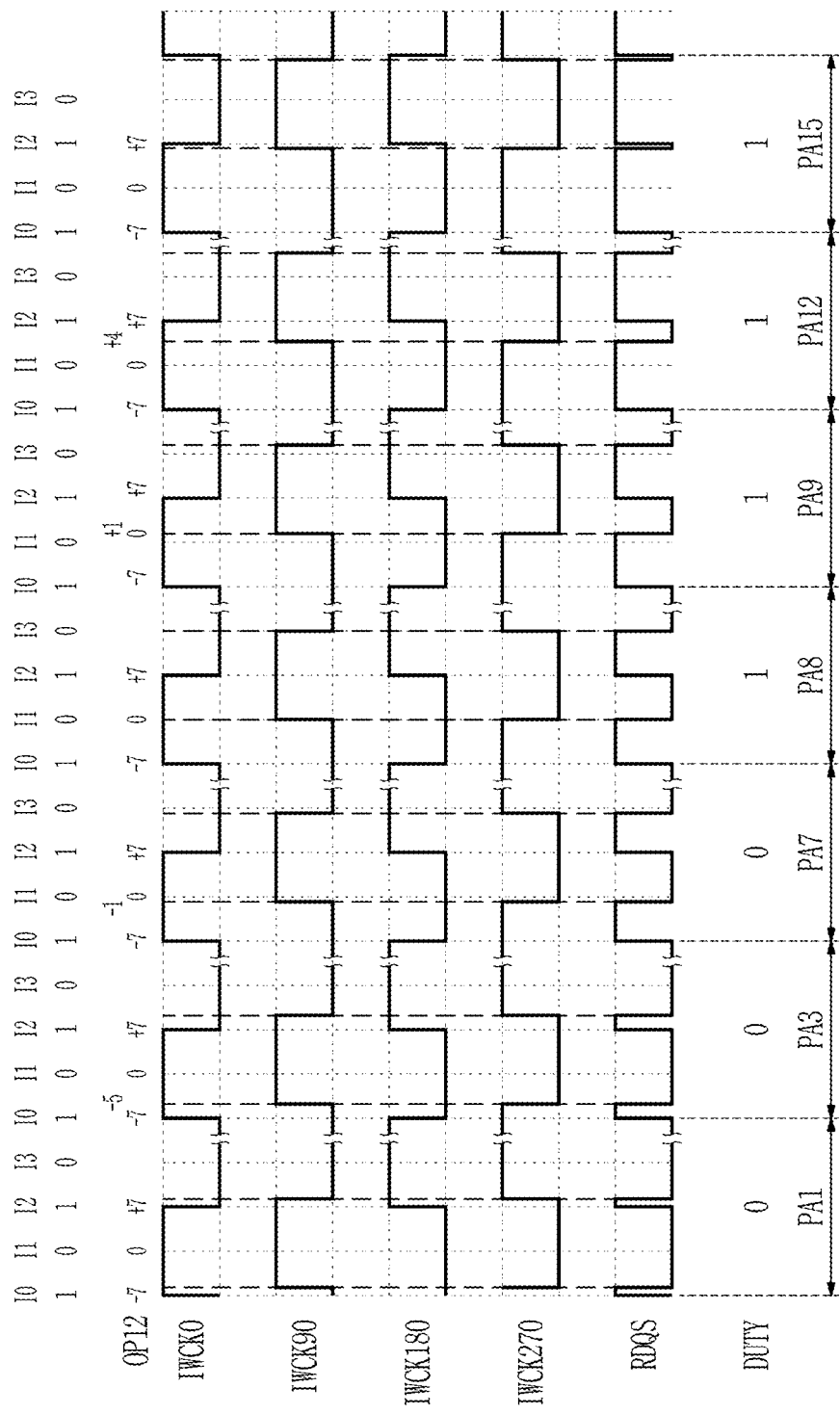
FIG. 11 and FIG. 12 are graphs that illustrate waveforms of input and output signals of a clock control circuit and a read circuit.
Figure 12:
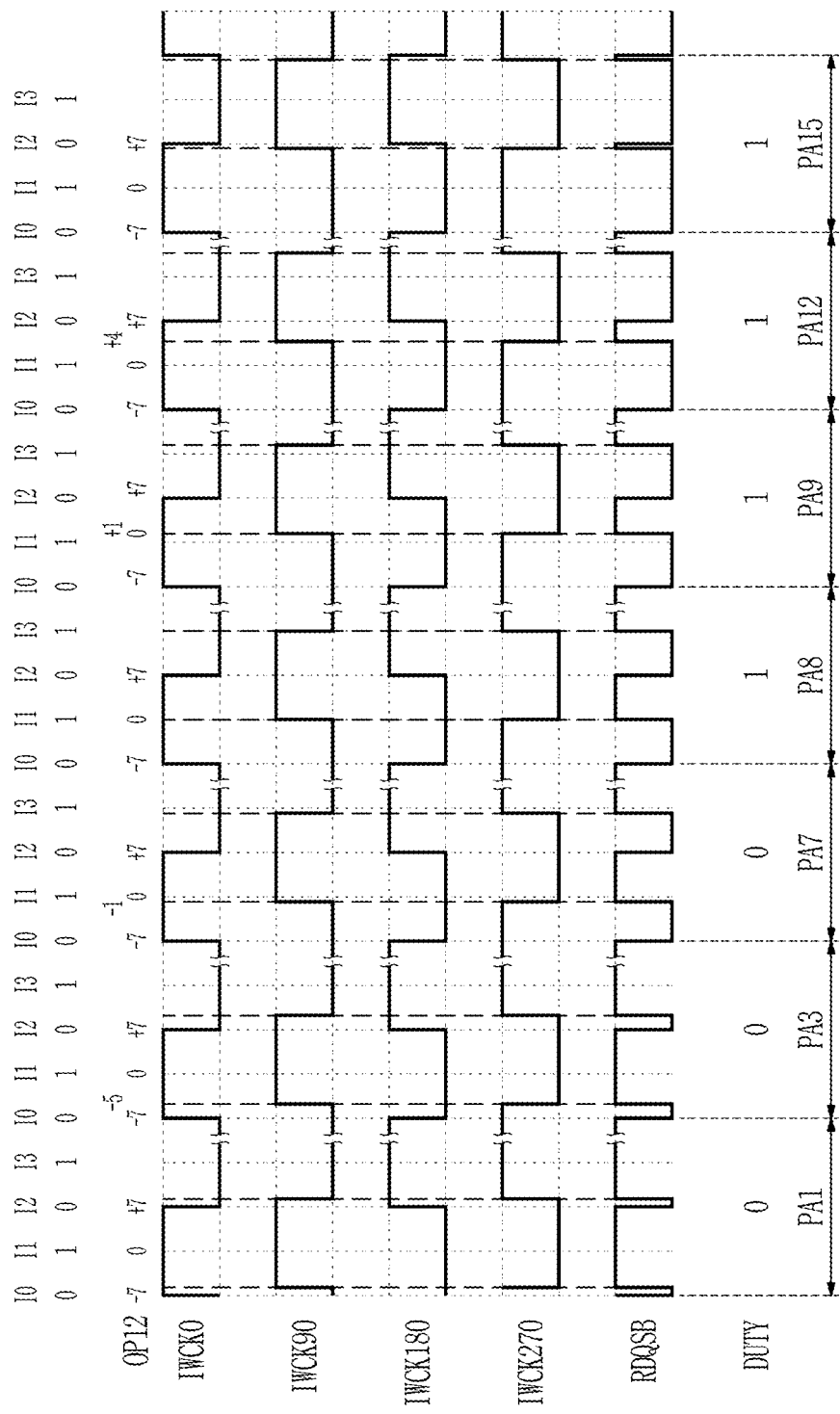

FIG. 11 and FIG. 12 are graphs illustrating the waveforms of the input and output signals of the clock control circuit and the read circuit.

Referring to FIG. 11, the first test patterns D0, D1, D2, and D3 "1010" may be provided to the input ends I0, I1, I2, and I3. The selector 440 may output "1010" provided to the input ends I0, I1, I2, and I3 as the read DQS RDQS on the rising edge of internal data clock signals IWCK0, IWCK90, IWCK180, and IWCK270. At the rising edge of the internal data clock signal IWCK0, the logic value "1" of the first test pattern D0 provided to the input end I0 may be output as the read DQS RDQS. At the rising edge of the internal data clock signal IWCK90, the logic value "0" of the first test pattern D1 provided to the input end I1 may be output as the read DQS RDQS. At the rising edge of the internal data clock signal IWCK180, the logic value "1" of the first test pattern D2 provided to the input end I3 may be output as the read DQS RDQS. At the rising edge of the internal data clock signal IWCK270, the logic value "0" of the first test pattern D3 provided to the input end I1 may be output as the read DQS RDQS.

A second code OP22 may be provided to the second buffer 410b of the clock control circuit 400. In each period PA1, ..., PA3, ..., PA7, PA8, PA9, ..., PA12, ..., and PA15, the system-on-chip 300 may adjust the second code OP22. Then, in each period PA1, ..., PA3, ..., PA7, PA8, PA9, ..., PA12, ..., and PA15, the clock control circuit 400 may adjust the delay of data clock signals WCK90 and WCK270 with the steps −7, ..., −5, ..., −1, 0, 1, ..., 4, ..., and 7 and output as the internal data clock signals IWCK90 and IWCK270. The read circuit 402 may output the read DQS RDQS according to the internal data clock signals IWCK90 and IWCK270 of which the delay is adjusted. The system-on-chip 300 may receive the read DQS RDQS of the memory device 200 and determine whether the duty cycle of the read DQS RDQS is equal to or greater than the duty cycle reference value. Since the duty cycle of the read DQS RDQS in the first to seventh periods PA1, ..., and PA7 is less than the duty cycle reference value, the system-on-chip 300 may determine the duty DUTY as a logic value "0". Since the duty cycle of the read DQS RDQS in the eighth period to the fifteenth period PA8, ..., and PA15 is greater than or equal to the duty cycle reference value, the system-on-chip 300 may determine the duty DUTY as a logic value "1".

Referring to FIG. 12, second test patterns D0, D1, D2, and D3 "0101" inverted from the first test patterns D0, D1, D2, and D3 "1010" according to the control signal FLIP may be provided to the input ends I0, I1, I2, and I3. The selector 440 may output "0101" provided to the input ends I0, I1, I2, and I3 as a read DQSB RDQSB on the rising edge of the internal data clock signals IWCK0, IWCK90, IWCK180, and IWCK270. At the rising edge of the internal data clock signal IWCK0, the logic value "0" of the first test pattern D0 provided to the input end I0 may be output as the read DQSB RDQSB. At the rising edge of the internal data clock signal IWCK90, the logic value "1" of the first test pattern D1 provided to the input end I1 may be output as the read DQSB RDQSB. At the rising edge of the internal data clock signal IWCK180, the logic value "0" of the first test pattern D2 provided to the input end I2 may be output as the read DQSB RDQSB. At the rising edge of the internal data clock signal IWCK270, the logic value "1" of the first test pattern D3 provided to the input end I3 may be output as the read DQSB RDQSB. The system-on-chip 300 may receive the read DQSB RDQSB of the memory device 200 and determine whether the duty cycle of the read DQSB RDQSB is equal to or greater than the duty cycle reference value. Since the duty cycle of the read DQSB RDQSB in the first to seventh periods PA1, ..., and PA7 is less than the duty cycle reference value, the system-on-chip 300 may determine the duty DUTY as a logic value "0". Since the duty cycle of the read DQSB RDQSB in the eighth period to the fifteenth period PA8, ..., and PA15 is greater than or equal to the duty cycle reference value, the system-on-chip 300 may determine the duty DUTY as a logic value "1". In FIG. 11 and FIG. 12, the second code OP22 is described to be sequentially increased from the operation −7 to the operation 7, but the method in which the system-on-chip 300 adjusts the second code OP22 is not limited thereto.

The system-on-chip 300 may determine the final value of the second code OP22 based on the duty DUTY according to the second code OP22 of the first test pattern and the duty DUTY according to the second code OP22 of the second test pattern.

The system-on-chip 300 provides the second code OP22 for controlling the second buffer 420b to the memory device 200, and may determine the final value of the second code OP22 based on the read DQS and the read DQSB input from the memory device 200. As a result, the system-on-chip 300 may train the internal data clock signals IWCK0, IWCK90, IWCK180, and IWCK270 such that there may be an exact 90 degree phase difference between two adjacent internal data clock signals among internal data clock signals IWCK0, IWCK90, IWCK180, and IWCK270.

Figure 13:
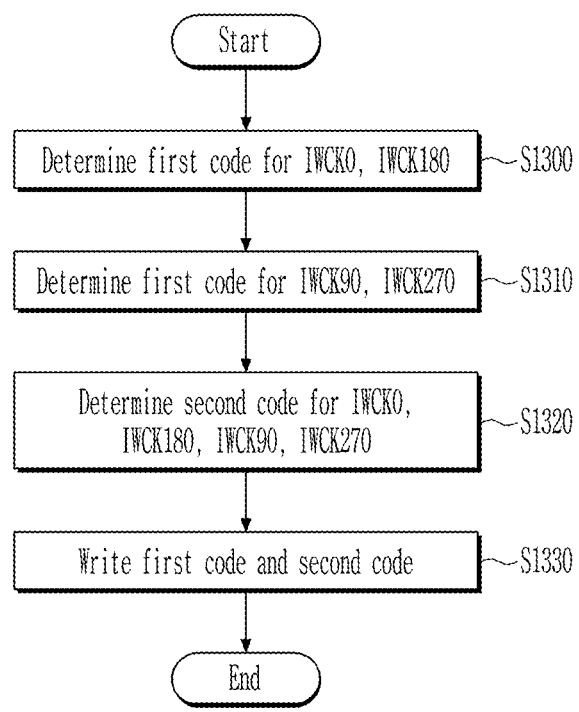
FIG. 13 is a flowchart of a clock training method according to an embodiment.

FIG. 13 is a flowchart of a clock training method according to an embodiment.

The system-on-chip 300 determines the first code OP11, which adjusts the duty cycle of two internal data clock signals IWCK0 and IWCK180 having a complementary phase among the internal data clock signals IWCK0, IWCK90, IWCK180, and IWCK270 (S1300). The system-on-chip 300 may determine the first code OP11 that controls the DCA that adjusts the duty cycle of the internal data clock signals IWCK0 and IWCK180 of the memory device 200 based on the signal RDQS output from the memory device 200.

The system-on-chip 300 determines the first code OP12, which adjusts the duty cycle of two internal data clock signals IWCK90 and IWCK270 having a complementary phase among the internal data clock signals IWCK0, IWCK90, IWCK180, and IWCK270 (S1310). The system-on-chip 300 may determine the first code OP12 that controls the DCA that adjusts the duty cycle of the internal data clock signals IWCK90 and IWCK270 of the memory device 200 based on the signal RDQSB output from the memory device 200. In an embodiment, the order of operation S1300 and S1310 is not limited.

The system-on-chip 300 determines the second code OP21 or OP22 that adjusts the delay of at least a pair of complementary internal data clock signals IWCK0 and IWCK180 or IWCK90 and IWCK270 among internal data clock signals IWCK0, IWCK90, IWCK180, and IWCK270 (S1320).

The system-on-chip 300 writes the first codes OP11 and OP12 and the second codes OP21 and OP22 to the mode register 222 of the memory device 200 by issuing the MRW command (S1330). Then, the memory device 200 may adjust the duty cycle of the internal data clock signals IWCK0, IWCK90, IWCK180, and IWCK270 using the first codes OP11 and OP12 and the second codes OP21 and OP22 stored in the mode register 222.

Accordingly, the system-on-chip 300 may perform training of the data clock signal WCK of the memory device 200.

Next, referring to FIG. 14, FIG. 15, and FIG. 16, each operation of FIG. 13 will be described in detail.

Figure 14:
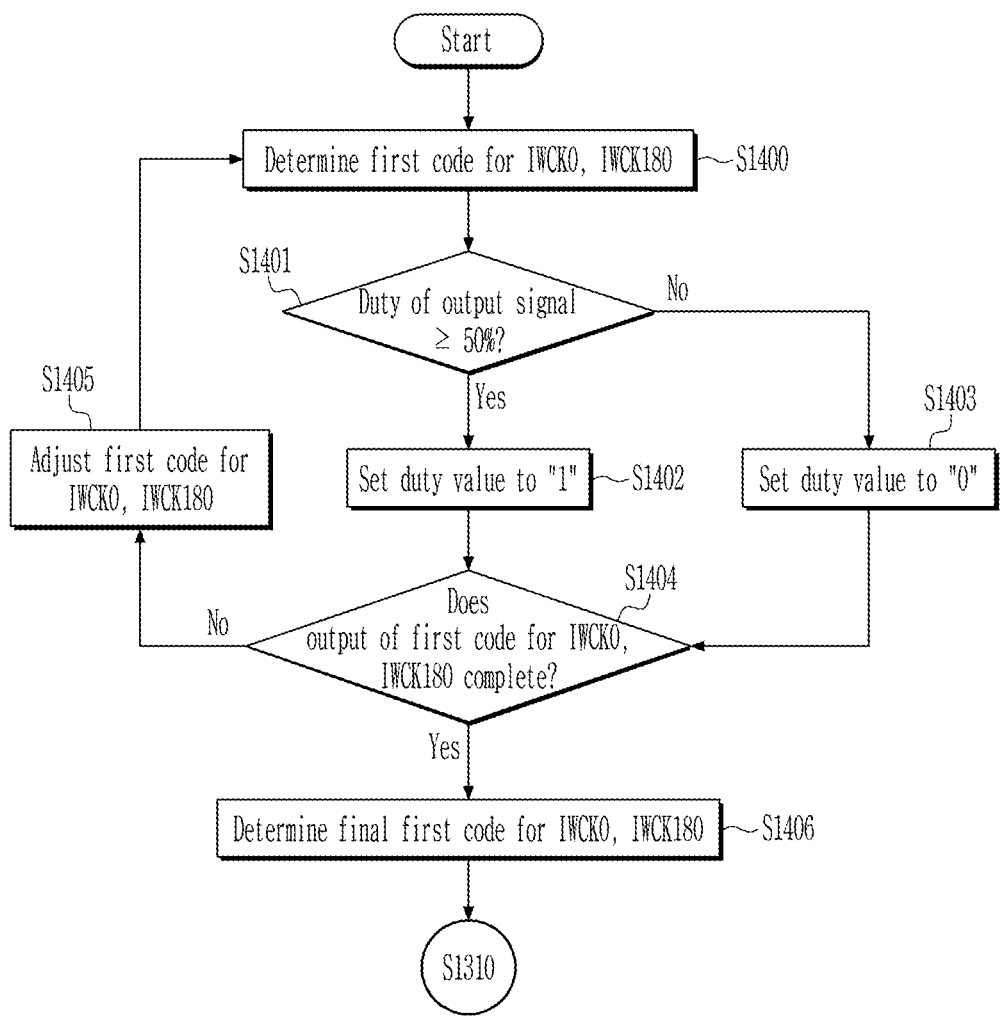
FIG. 14, FIG. 15, and FIG. 16 are flowcharts that illustrate some operations of the clock training method according to an embodiment.
Figure 15:
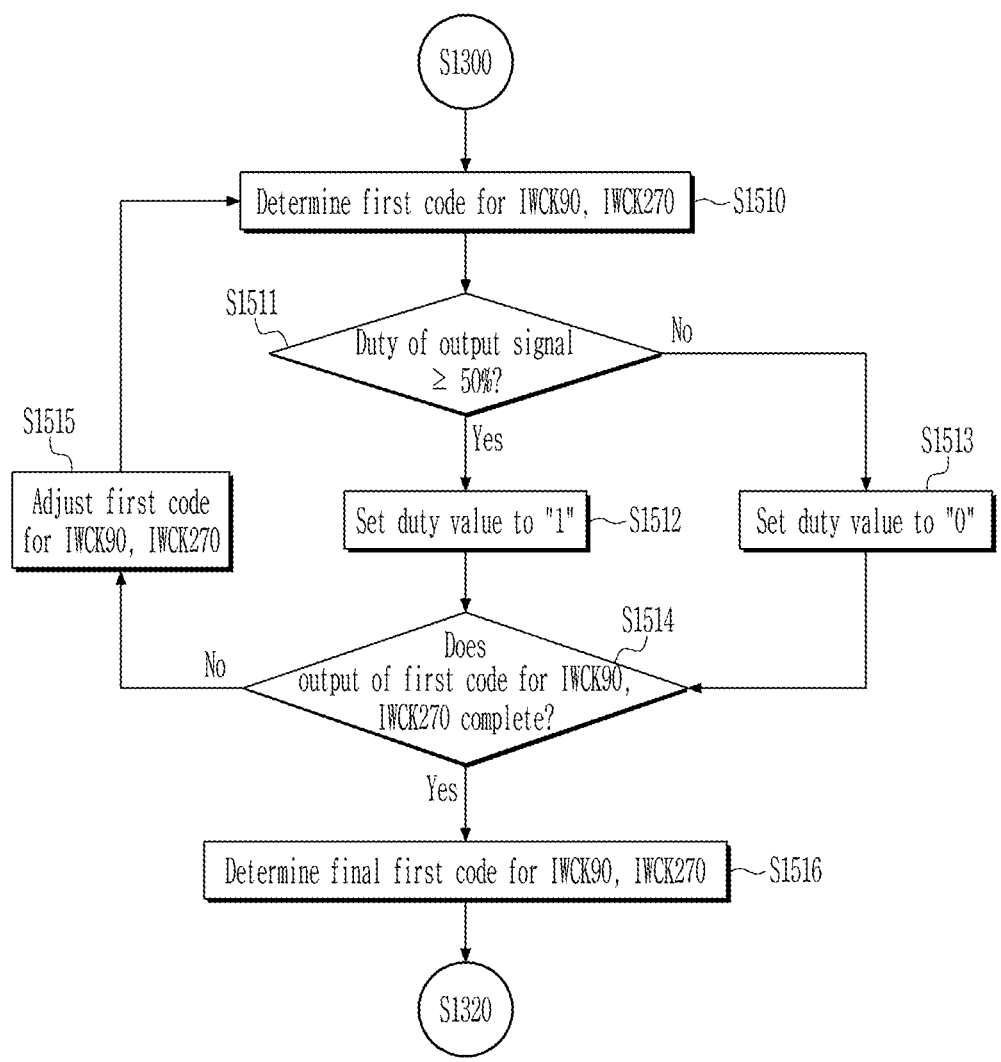
Figure 16:
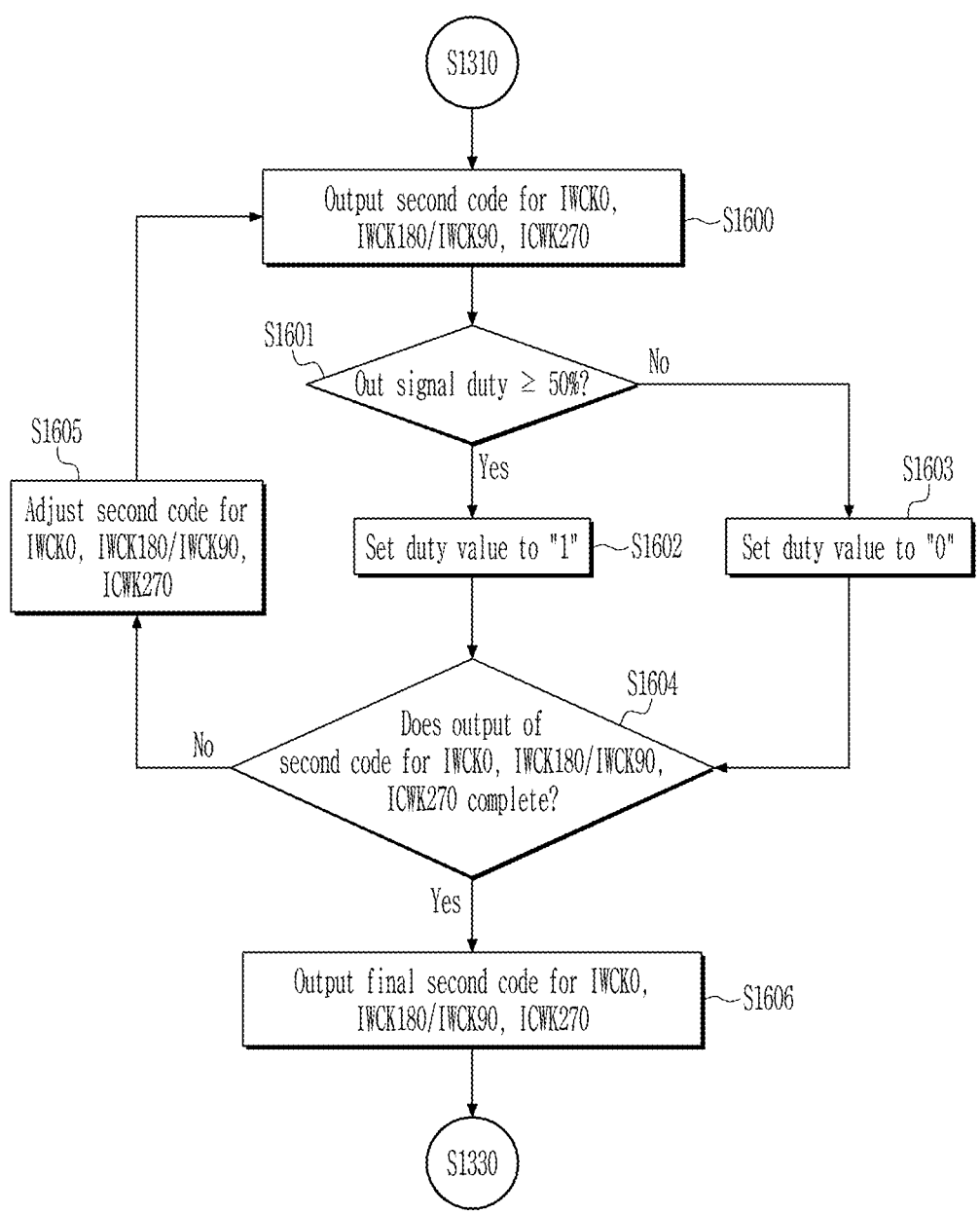

FIG. 14, FIG. 15, and FIG. 16 are flowcharts that illustrate some operations of the clock training method according to the embodiment.

Referring to FIG. 14, the system-on-chip 300 outputs a plurality of data clock signals WCK0, WCK180, WCK90, WCK270, and outputs the first code OP11 that adjusts the duty cycle of two internal data clock signals IWCK0 and IWCK180 having a complementary phase among the internal data clock signals IWCK0, IWCK90, IWCK180, and IWCK270 generated based on the plurality of data clock signals WCK0, WCK180, WCK90, and WCK270 is output to the memory device 200 (S1400). In this case, the system-on-chip 300 may provide the first codes OP12 and the second codes OP21 and OP22 as default values.

The system-on-chip 300 determines whether the duty cycle of the output signal RDQS or RDQSB of the memory device 200 is greater than or equal to the duty cycle reference value (e.g., 50%) (S1401).

When the duty cycle of the output signal RDQS or RDQSB of the memory device 200 is greater than or equal to the duty cycle reference value (e.g., 50%), the system-on-chip 300 sets the duty value to "1" (S1402). When the duty cycle of the output signal RDQS or RDQSB of the memory device 200 is less than the duty cycle reference value, the system-on-chip 300 sets the duty value to "0" (S1403).

The system-on-chip 300 determines whether the output of all first code OP11 is completed (S1404). The system-on-chip 300 may determine whether all the plurality of first codes OP11 indicating a predetermined plurality of steps are output during this training.

When the output of all the first codes OP11 is not completed, the system-on-chip 300 adjusts the first code OP11 (S1405). The system-on-chip 300 may provide by increasing or decreasing the value of the first code OP11. For example, when the first code OP11 indicating the operation −7 is output in S1400, the first code OP11 adjusted in S1405 may indicate the operation −6.

When outputs of all the first codes OP11 are completed, the system-on-chip 300 determines the final value OP11 of the first codes based on an output signal RDQS or RDQSB from the memory device 200 (S1406). S1400 to S1405 may be performed with respect to the first test pattern and the second test pattern. The system-on-chip 300 may determine the final value of the first code OP11 based on the read DQS RDQS with the first test pattern output in synchronization with the internal data clock signals IWCK0 and IWCK180 of which the clock cycle is adjusted according to the first code OP11 and the read DQSB RDQSB with the second test pattern output in synchronization with the internal data clock signals IWCK0 and IWCK180 of which the clock cycle is adjusted according to the first code OP11.

Referring to FIG. 15, the system-on-chip 300 outputs the first code OP12 that adjusts the duty cycle of the two internal data clock signals IWCK90 and IWCK270 having complementary phases among the internal data clock signals IWCK0, IWCK90, IWCK180, and IWCK270 generated based on the plurality of data clock signals WCK0, WCK180, WCK90, and WCK270 (S1500). In this case, the system-on-chip 300 provides the first code OP11 with the value determined in S1300 of FIG. 13, and provides the second codes OP21 and OP22 by setting as default values.

The system-on-chip 300 determines whether the duty cycle of the output signal of the memory device 200 is greater than or equal to the duty cycle reference value (S1501).

When the duty cycle of the output signal of the memory device 200 is greater than or equal to the duty cycle reference value (e.g., 50%), the system-on-chip 300 sets the duty value to "1" (S1502). When the duty cycle of the output signal of the memory device 200 is less than the duty cycle reference value, the system-on-chip 300 sets the duty value to "0" (S1503).

The system-on-chip 300 determines whether the output of all first codes OP12 is completed (S1504). The system-on-chip 300 may determine whether all the plurality of first codes OP12 indicating a predetermined plurality of steps are output during this training.

When the output of all the first codes OP12 is not completed, the system-on-chip 300 adjusts the first codes OP12 (S1505). The system-on-chip 300 may provide the first codes OP12 by increasing or decreasing the value of the first codes OP12.

When the output of all first codes OP12 is completed, the system-on-chip 300 determines the final value of the first code OP12 based on a signal RDQS or RDQSB output from the memory device 200 (S1506). S1500 to S1505 may be performed with respect to the first test pattern and the second test pattern. The system-on-chip 300 may determine the final value of the first code OP12 based on the read DQS RDQS with the first test pattern output in synchronization with the internal data clock signals IWCK90 and IWCK270 of which the clock cycle is adjusted according to the first code OP12 and the read DQSB RDQSB with the second test pattern output in synchronization with the internal data clock signals IWCK90 and IWCK270 of which the clock cycle is adjusted according to the first code OP12.

Referring to FIG. 16, the system-on-chip 300 outputs the second codes OP21 and OP22 that adjust the delay of the internal data clock signals IWCK0, IWCK90, IWCK180, and IWCK270 to the memory device 200 (S1600). In this case, the system-on-chip 300 may provide the first code OP11 with the value determined in S1300 of FIG. 13, and provide the first code OP12 with the value determined in S1310 of FIG. 13.

The system-on-chip 300 determines whether the duty cycle of the output signal RDQS or RDQSB of the memory device 200 is greater than or equal to the duty cycle reference value (e.g., 50%) (S1601).

When the duty cycle of the output signal RDQS or RDQSB of the memory device 200 is greater than the duty cycle reference value (e.g., 50%), the system-on-chip 300 sets the duty value to "1" (S1602). When the duty cycle of the output signal RDQS or RDQSB of the memory device 200 is less than the duty cycle reference value, the system-on-chip 300 sets the duty value to "0" (S1603).

The system-on-chip 300 determines whether the output of all second codes OP21 and OP22 is completed (S1604). The system-on-chip 300 may determine whether a plurality of second codes OP21 and OP22 indicating a predetermined plurality of steps are output during this training.

When the output of all the second codes OP21 and OP22 is not completed, the system-on-chip 300 adjusts the second codes OP21 and OP22 (S1605). The system-on-chip 300 may provide the second codes OP21 and OP22 by increasing or decreasing the values of the second codes OP21 and OP22. For example, when the second code OP21 indicating the operation −7 is output in S1600, the second code OP31 adjusted in S1605 may indicate the operation −6. The system-on-chip 300 may adjust one of the second codes OP21 and OP22, and may not adjust the other, or both the second codes OP21 and OP22.

When outputs of all the second codes OP21 and OP22 are completed, the system-on-chip 300 determines the final values of the second codes OP21 and OP22 based on the signal output from the memory device 200 (S1606). S1600 to S1605 may be performed with respect to the first test pattern and the second test pattern. The system-on-chip 300 may determine final values of the second codes OP21 and OP22 based on the read DQS RDQS with the first test pattern output in synchronization with the internal data clock signals IWCK0, IWCK90, IWCK180, and IWCK270 of which the delay is adjusted according to the second codes OP21 and OP22 and the read DQSB RDQSB with the second test pattern output in synchronization with the internal data clock signals IWCK0, IWCK90, IWCK180, and IWCK270 of which the delay is adjusted according to the second codes OP21 and OP22.

In the above, the system-on-chip 300 may determine whether the duty cycle of the read DQS and/or the read DQSB output from the memory device 200 is equal to or greater than the duty cycle reference value. The read DQS and/or the read DQSB may be provided to the system-on-chip 300 through the interface between the memory device and the system-on-chip 300. The system-on-chip 300 may determine whether the duty cycle of the read DQS and/or read DQSB to which the skew and delay according to the interface are reflected is greater than or equal to the standard value. Therefore, since the data clock signal of the memory device 200 is trained by reflecting the skew, delay, and the like, it is possible to output the signal at more accurate timing during the actual read operation.

Figure 17:
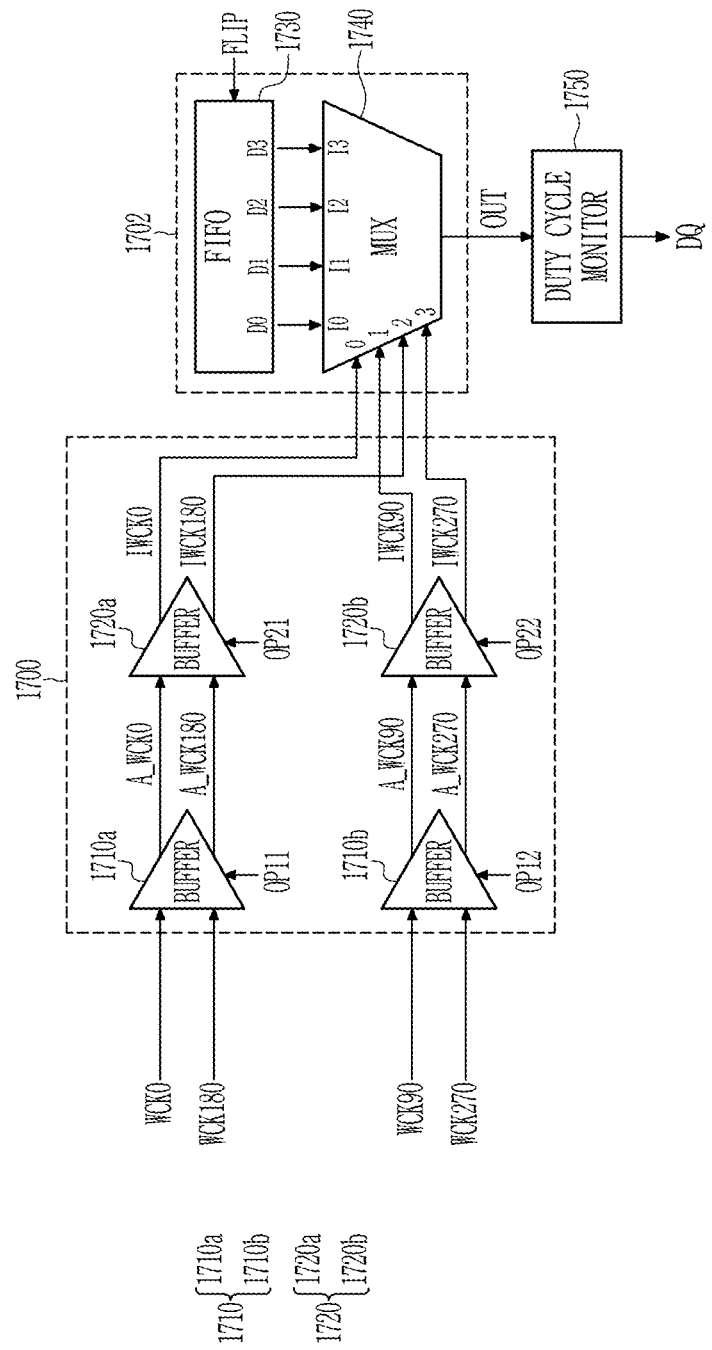
FIG. 17 is a block diagram of a clock control circuit and a read circuit according to an embodiment.

FIG. 17 is a block diagram of a clock control circuit and a read circuit according to an embodiment.

Referring to FIG. 17, a clock control circuit 1700 may include a first buffer 1710 and a second buffer 1720, and a read circuit 1702 may include a FIFO 1730, a selector 1740, and a duty cycle detector 1750. Compared to FIG. 4, descriptions of the same or similar components will be omitted.

The selector 1740 serializes the first test patterns D0, D1, D2, and D3 provided to the input ends I0, I1, I2, and I3 and output as an output signal OUT at the edge of the internal data clock signals IWCK0, IWCK90, IWCK180, and IWCK270.

The duty cycle detector 1750 may monitor a duty cycle of the output signal OUT output by the selector 1740. In an embodiment, the duty cycle detector 1750 may detect whether the duty cycle of the output signal OUT is greater than or equal to a duty cycle reference value. The duty cycle detector 1750 may output a value as a DQ according to whether the duty cycle of the output signal OUT is equal to or greater than the duty cycle reference value.

The training circuit 330 of FIG. 3 may determine the final values of the first codes OP11 and OP12 and the final values of the second codes OP21 and OP22 based on the DQ received when the first codes OP11 and OP12 and the second codes OP21 and OP22 are adjusted.

Even in the present embodiment in which the read circuit 1702 includes a duty cycle detector 1750, training of FIG. 13 can also be performed.

Referring to FIG. 13, the system-on-chip 300 determines the first code OP11 to adjust the duty cycle of two internal data clock signals IWCK0 and IWCK180 with complementary phases among internal data clock signals IWCK0, IWCK90, IWCK180, and IWCK270 (S1300). The system-on-chip 300 may determine the first code OP11 that controls the DCA that adjusts the duty cycle of the internal data clock signals IWCK0 and IWCK180 of the memory device 200 based on the signal DQ output from the memory device 200.

The system-on-chip 300 determines the first code OP12 that adjusts the duty cycle of two internal data clock signals IWCK90 and IWCK270 having complementary phases among the internal data clock signals IWCK0, IWCK90, IWCK180, and IWCK270 (S1310). The system-on-chip 300 may determine the first code OP12 that controls the DCA adjusting the duty cycle of the internal data clock signals IWCK90 and IWCK270 of the memory device 200 based on the signal DQ output from the memory device 200. In an embodiment, the order of S1300 and S1310 is not restrictive.

The system-on-chip 300 determines the second code OP21 and/or OP22 that adjusts the delay of at least one pair of complementary internal data clock signals IWCK0 and IWCK180 or IWCK90 and IWCK270 among the internal data clock signals IWCK0, IWCK90, IWCK180, and IWCK270 (S1320).

The system-on-chip 300 writes the first codes OP11 and OP12 and the second codes OP21 and OP22 to the mode register 222 of the memory device 200 by issuing the MRW command (S1330). Then, the memory device 200 may adjust the duty cycle of the internal data clock signals IWCK0, IWCK90, IWCK180, and IWCK270 using the first codes OP11 and OP12 and the second codes OP21 and OP22 stored in the mode register 222.

Accordingly, the system-on-chip 300 may perform training of the data clock signal WCK of the memory device 200.

Figure 18:
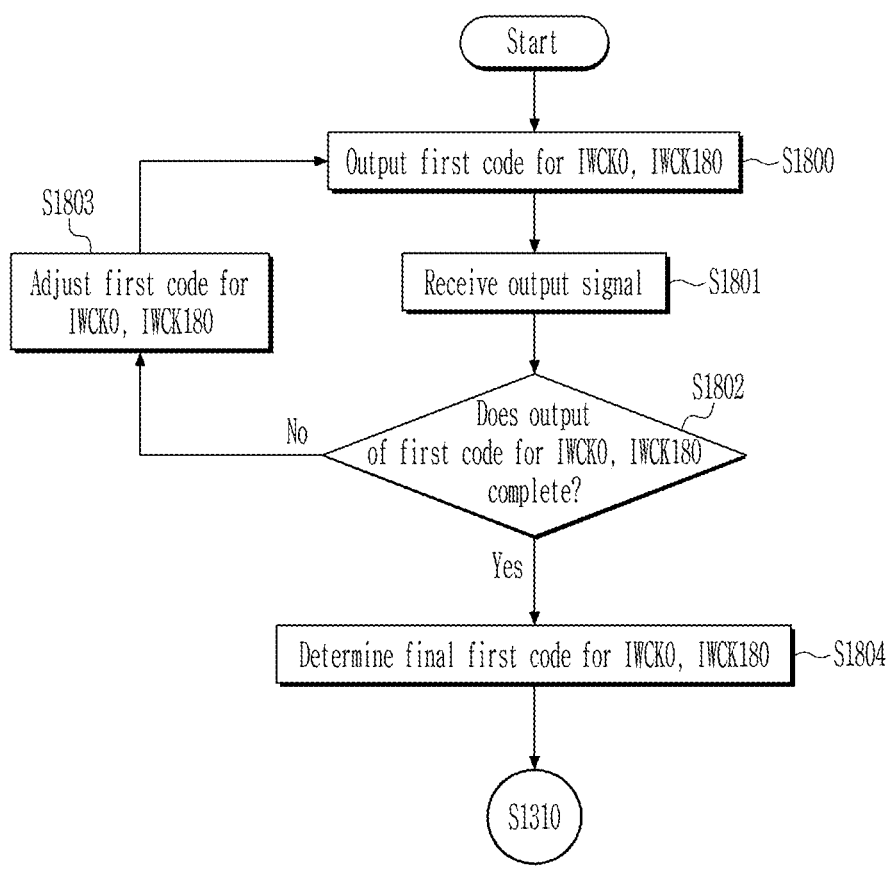
FIG. 18, FIG. 19, and FIG. 20 are flowcharts that illustrate some operations of the clock training method according to an embodiment.
Figure 19:
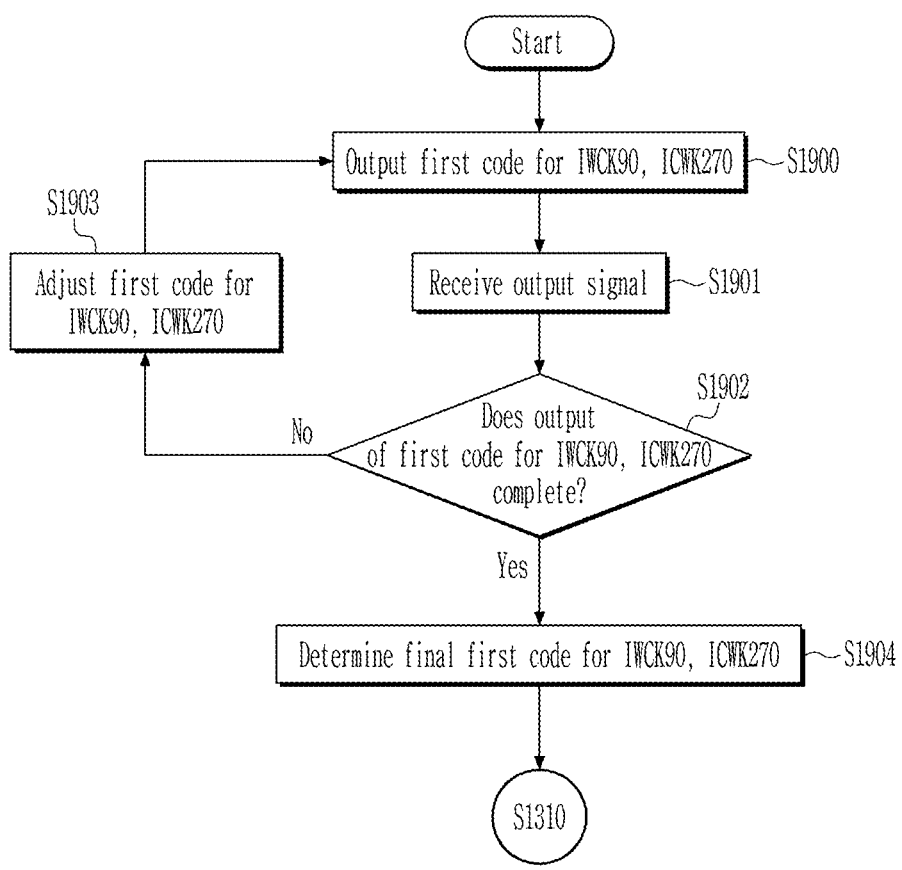
Figure 20:
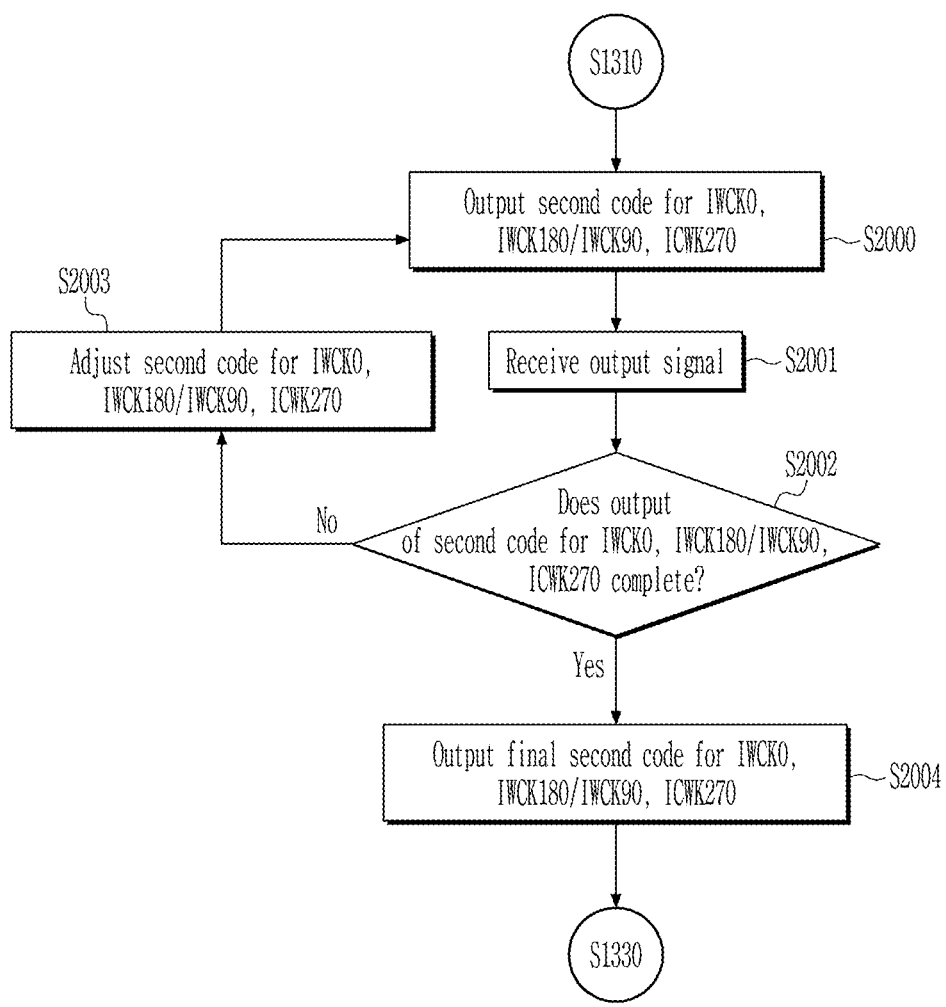

FIG. 18 to FIG. 20 are flowcharts that illustrate some operations of the clock training method according to an embodiment.

Referring to FIG. 18, the system-on-chip 300 uses the first code OP11 to adjust the duty cycle of two internal data clock signals (IWCK0, IWCK180) having a complementary phase among the internal data clock signals (IWCK0, IWCK90, IWCK180, IWCK270) memory device 200 (S1800). In this case, the system-on-chip 300 may provide the first codes OP12 and second codes OP21 and OP22 as default values.

The system-on-chip 300 receives the output signal DQ of the memory device 200 (S1801).

The system-on-chip 300 determines whether the output of all first codes OP11 is completed (S1802). The system-on-chip 300 may determine whether all the plurality of first codes OP11 indicating a predetermined plurality of steps are output during this training.

When the output of all the first codes OP11 is not completed, the system-on-chip 300 adjusts the first code OP11 (S1803).

When the output of all the first codes OP11 is completed, the system-on-chip 300 determines the final value of the first code OP11 based on the output signal DQ from the memory device 200 (S1804). S1800 to S1803 may be performed with respect to the first test pattern and the second test pattern. The system-on-chip 300 may determine the final value of the first code OP11 based on the signal DQ that instructs the duty cycle of the signal OUT output with the first test pattern in synchronization with the internal data clock signals IWCK0 and IWCK180 and the signal DQ that instructs the duty cycle of the signal OUT output with the second test pattern in synchronization with the internal data clock signals IWCK0 and IWCK180.

Referring to FIG. 19, the system-on-chip 300 outputs the first code OP12 that adjusts the duty cycle of two internal data clock signals IWCK90 and IWCK270 having complementary phases among the internal data clock signals IWCK0, IWCK90, IWCK180, and IWCK270 to the memory device 200 (S1900). In this case, the system-onchip 300 may provide the first code OP11 with the value determined in S1300 of FIG. 13, and may provide the second codes OP21 and OP22 by setting default values.

The system-on-chip 300 receives the output signal DQ of the memory device 200 (S1901).

The system-on-chip 300 determines whether the output of all the first codes OP12 is completed (S1901). The system-on-chip 300 may determine whether all the plurality of first codes OP12 indicating a predetermined plurality of steps are output during this training.

When the output of all the first codes OP12 is not completed, the system-on-chip 300 adjusts the first code OP12 (S1903). The system-on-chip 300 may provide the first code OP12 by increasing or decreasing the value of first code OP12.

When the output of all the first codes OP12 is completed, the system-on-chip 300 determines the final value of the first code OP12 based on the signal output from the memory device 200 (S1904). S1900 to S1903 may be performed with respect to the first test pattern and the second test pattern. The system-on-chip 300 may determine the final value of the first code OP12 based on the signal DQ that instructs the duty cycle of the signal OUT output with the first test pattern in synchronization with the internal data clock signals IWCK90 and IWCK270 and the signal DQ that instructs the duty cycle of the signal OUT output with the second test pattern in synchronization with the internal data clock signals IWCK90 and IWCK270.

Referring to FIG. 20, the system-on-chip 300 outputs the second codes OP21 and OP22 that adjust the delays of the internal data clock signals IWCK0, IWCK90, IWCK180, and IWCK270 to the memory device 200 (S2000). In this case, the system-on-chip 300 may provide the first code OP11 with the value determined in S1300 of FIG. 13, and may provide the first code OP12 with the value determined in S1310 of FIG. 13.

The system-on-chip 300 receives the output signal DQ of the memory device 200 (S2001).

The system-on-chip 300 determines whether the output of all the second codes OP21 and OP22 is completed (S2002). The system-on-chip 300 may determine whether all the plurality of second codes OP21 and OP22 indicating a predetermined plurality of steps are output during this training.

When the output of all the second codes OP21 and OP22 is not completed, system-on-chip 300 adjusts second codes OP21 and OP22 (S2003). The system-on-chip 300 may provide the second codes OP21 and OP22 by increasing or decreasing the values of the second codes OP21 and OP22. For example, when the second code OP21 indicating the operation −7 is output in S2000, the first code OP21 adjusted in S2005 may indicate the operation −6. The system-on-chip 300 may adjust one of the second codes OP21 and OP22, and may not adjust the other, or both the second codes OP21 and OP22.

When the output of all the second codes OP21 and OP22 is completed, the system-on-chip 300 determines final values of the second codes OP21 and OP22 based on the signal output from the memory device 200 (S2004). S2000 to S2003 may be performed with reference to the first test pattern and the second test pattern. The system-on-chip 300 may determine the final values of the second codes OP21 and OP22 based on the signal DQ that instructs the duty cycle of the signal OUT output with the first test pattern in synchronization with the internal data clock signals IWCK0, IWCK90, IWCK180, and IWCK270 and the signal DQ that instructs the duty cycle of the signal OUT output with the second test pattern in synchronization with the internal data clock signals IWCK0, IWCK90, IWCK180, and IWCK270.

The memory device 200 may output a signal DQ indicating the duty cycle of a signal OU) that is output by serializing the first test pattern in synchronization with the internal data clock signals IWCK0, IWCK90, IWCK180, and IWCK270. The system-on-chip 300 may perform training of the data clock signal WCK of the memory device 200 based on the signal DQ output from the memory device 200.

Figure 21:
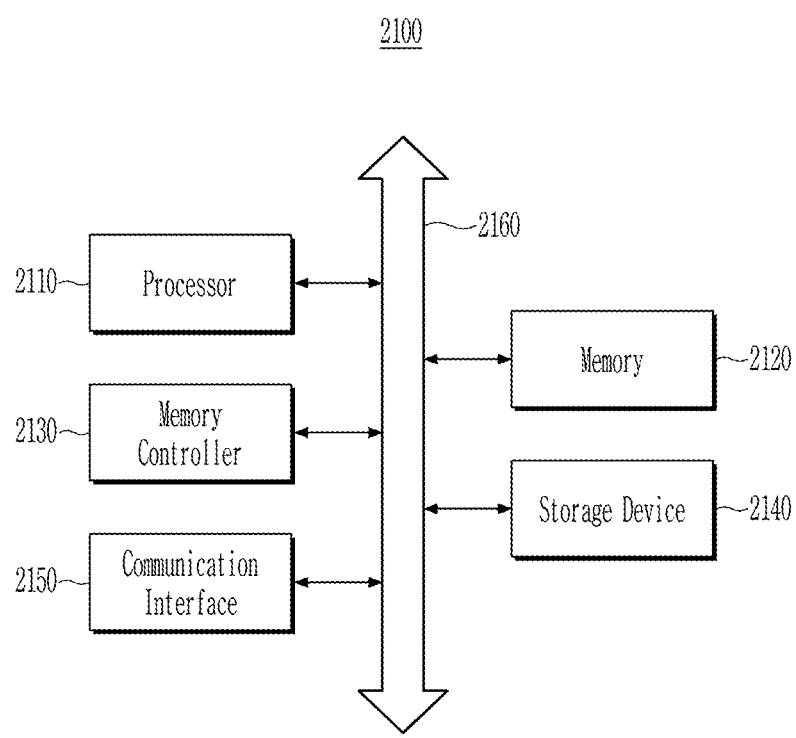
FIG. 21 is an example block diagram of a computer system according to an embodiment.

FIG. 21 is an example block diagram of a computer system according to an embodiment.

Referring to FIG. 21, a computing system 2100 includes a processor 2110, a memory 2120, a memory controller 2130, a storage device 2140, a communication interface 2150, and a bus 2160. The computing system 2100 may further include other general constituent elements.

The processor 2110 controls the overall operation of each component of the computing system 2100. The processor 2110 may be implemented as at least one of various processing units such as a central processing unit (CPU), an application processor (AP), and a graphics processing unit (GPU).

The memory 2120 stores various data and commands. The memory 2120 may be implemented with the memory device described with reference to FIG. 1 to FIG. 12. The memory controller 2130 controls transmission of data or commands to and from the memory 2120.

The processor 2110 and the memory controller 2130 may be implemented as the system-on-chip described with reference to FIG. 1 to FIG. 20. In some embodiments, the memory controller 2130 may be provided as an internal configuration of the processor 2110. In some embodiments, the memory controller 2130 may be provided as a separate chip from the processor 2110.

The memory controller 2130 may perform, based on the output signal from the memory 2120, training of the internal data clock signal IWCK generated based on the data clock signal WCK. The memory 2120 may output the first test pattern in synchronization with the internal data clock signal IWCK, or output the second test pattern inverted with the first test pattern in synchronization with the internal data clock signal IWCK. The memory controller 2130 may adjust the duty cycle of the data clock signal WCK based on the output signal, or may provide a code for adjusting the delay to the memory 2120.

The storage device 2140 non-temporarily stores programs and data. In some embodiments, the storage device 2140 may be implemented with a non-volatile memory. The communication interface 2150 supports the wireless Internet communication of the computing system 2100. In addition, the communication interface 2150 may support various communication methods other than Internet communication. The bus 2160 provides a communication function between constituent elements of the computing system 2100. The bus 2160 may include at least one type of bus according to a communication protocol between constituent elements.

In some embodiments, each of the constituent elements or a combination of two or more constituent elements described with reference to FIG. 1 to FIG. 20 may be implemented as a digital circuit, a programmable or non-programmable logic device or array, an application specific integrated circuit (ASIC), and the like.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A semiconductor device comprising:
a clock generation circuit configured to output a plurality of clock signals that have different phases to a memory device, an internal clock signal of the memory device being generated responsive to the plurality of clock signals; and
a training circuit configured to receive an output signal output based on the internal clock signal from the memory device, to adjust a value of a code used to generate the internal clock signal by adjusting a phase of at least one clock signal among the plurality of clock signals, to determine a final value of the code based on a duty cycle of the output signal, which is changed according to the adjustment of the value of the code, and to write the final value to the memory device.

2. The semiconductor device of claim 1, wherein
the training circuit is configured to determine the final value based on values of the code that change the duty cycle of the output signal more than a duty cycle reference value.

3. The semiconductor device of claim 2, wherein
the training circuit comprises a duty cycle detector configured to determine a duty value of the output signal according to whether the duty cycle of the output signal is greater than or equal to the duty cycle reference value, and
the training circuit is configured to determine the final value based on the values of the code in which the duty value of the output signal changes.

4. The semiconductor device of claim 3, wherein
the duty cycle detector is configured to determine a duty value of a first output signal output by the memory device in synchronization with the internal clock signal for a first test pattern and a duty value of a second output signal output by the memory device in synchronization with the internal clock signal of a second test pattern, which is inverted from the first test pattern, and
the training circuit is configured to determine the final value based on two adjacent values of the code at which the duty value of the first output signal changes and two adjacent values of the code at which the duty value of the second output signal changes.

5. The semiconductor device of claim 1, wherein
the training circuit is configured to determine the final value based on two adjacent values of the code that changes a value of a first output signal that outputs a duty value of a first signal determined according to whether a duty cycle of the first signal serialized from a first test pattern in synchronization with the internal clock signal by the memory device is greater than or equal to a duty cycle reference value and two adjacent values of the code that changes a value of a second output signal that outputs a duty value of a second signal determined according to whether a duty cycle of the second signal serialized from a second test pattern, which is inverted from the first test pattern, in synchronization with the internal clock signal, is greater than or equal to the duty cycle reference value.

6. The semiconductor device of claim 1, wherein
the code includes a code used in generation of the internal clock signal by adjusting a duty cycle of at least one clock signal among the plurality of clock signals.

7. The semiconductor device of claim 1, wherein
the code includes a code used in generation of the internal clock signal by adjusting a delay of at least one clock signal among the plurality of clock signals.

8. The semiconductor device of claim 1, wherein
the memory device is a low power double data rate 6 (LPDDR6) SDRAM.

9. An operation method of a semiconductor device, comprising:
outputting, to a memory device, a plurality of clock signals that have different phases and are used to generate an internal clock signal of the memory device;
outputting a code used to generate the internal clock signal by adjusting a phase of at least one clock signal among the plurality of clock signals;
receiving an output signal output based on the internal clock signal from the memory device;
adjusting a value of the code;
determining a final value of the code based on a duty cycle of the output signal, which changes according to adjustment of the value of the code; and
writing the final value to the memory device.

10. The operation method of the semiconductor device of claim 9, wherein
the determining the final value comprises determining the final value based on values of the code that change the duty cycle of the output signal by more than a duty cycle reference value.

11. The operation method of the semiconductor device of claim 10, further comprising determining a duty value of the output signal according to whether the duty cycle of the output signal is greater than or equal to the duty cycle reference value,
wherein the determining the final value based on the values of the code that change the duty cycle of the output signal comprises determining the final value based on the values of the code that change the duty value of the output signal.

12. The operation method of the semiconductor device of claim 11, wherein
the receiving the output signal from the memory device comprises:
receiving a first output signal that outputs a first test pattern in synchronization with the internal clock signal; and
receiving a second output signal that outputs a second test pattern inverted from the first test pattern in synchronization with the internal clock signal, and
the determining a duty value of the output signal comprises:
determining a duty value of the first output signal; and
determining a duty value of the second output signal, and
the determining the final value based on values of a code that changes the duty value of the output signal comprises:
determining the final value based on two adjacent values of the code that changes the duty value of the first output signal and two adjacent values of the code that changes the duty value of the second output signal.

13. The operation method of the semiconductor device of claim 10, wherein
the receiving the output signal from the memory device comprises:
receiving, as a first output signal from the memory device, a duty value of a first signal determined according to whether a duty cycle of the first signal that serializes a first test pattern in synchronization with the internal clock signal by the memory device is greater than or equal to the duty cycle reference value; and receiving, as a second output signal from the memory device, a duty value of a second signal determined according to whether a duty cycle of the second signal that serializes a second test pattern inverted from the first test pattern in synchronization with the internal clock signal is greater than or equal to the duty cycle reference value, and the determining the final value based on values of the code comprises determining the final value based on two adjacent values of the code that changes a value of the first output signal and two adjacent values of the code that changes a value of the second output signal.

14. The operation method of the semiconductor device of claim 9, wherein the code comprises a code used to generate the internal clock signal by adjusting the duty cycle of the at least one clock signal among the plurality of clock signals.

15. The operation method of the semiconductor device of claim 9, wherein the code comprises a code used to generate the internal clock signal by adjusting a delay of the at least one clock signal among the plurality of clock signals.

16. A computing system comprising:

a memory device including a clock control circuit configured to generate a plurality of internal clock signals by buffering a plurality of clock signals, each having a different phase, and to generate at least one internal clock signal among the plurality of internal clock signals by adjusting the phase of at least one of the plurality of clock signals according to a code, and a read circuit that is configured to serialize a test pattern based on the plurality of internal clock signals and to output an output signal; and a system-on-chip configured to adjust a value of the code, to determine a final value of the code based on a value of at least one code that changes a duty cycle of the output signal by more than a duty cycle reference value, and to write the final value in the memory device.

17. The computing system of claim 16, wherein the code comprises a first code and a second code, the final value comprises a final value of the first code and a final value of the second code, and the clock control circuit comprises:

a first buffer that is configured to adjust a duty cycle of the plurality of clock signals according to the first code, and a second buffer that is configured to adjust a delay of the plurality of clock signals according to the second code.

18. The computing system of claim 17, wherein the plurality of internal clock signals comprise a first internal clock signal and a second internal clock signal that have complementary phases, and a third internal clock signal and a fourth internal clock signal that have complementary phases, the test pattern comprises a first test pattern of which a value is changed in synchronization of the first internal clock signal and the second internal clock signal and is maintained in synchronization with the third internal clock signal and the fourth internal clock signal, and the system-on-chip is configured to determine a final value of the first code based on a value of at least one first code that changes a duty cycle of an output signal output based on the first test pattern by more than the duty cycle reference value.

19. The computing system of claim 18, wherein the test pattern comprises a second test pattern of which a value is changed in synchronization with the first internal clock signal to the fourth internal clock signal, and the system-on-chip is configured to determine a value of the second code based on the value of the second code that changes a duty cycle of an output signal output based on the second test pattern by more than the duty cycle reference value.

20. The computing system of claim 16, wherein the read circuit comprises:

a FIFO that is configured to output a first test pattern or a second test pattern inverted from the first test pattern; and a selector that is configured to serialize the first test pattern or the second test pattern in synchronization with the plurality of internal clock signals and to output the first test pattern or the second test pattern as the output signal.

* * * * *